United States Patent [19]
McClure

[11] Patent Number: 6,006,339
[45] Date of Patent: Dec. 21, 1999

[54] CIRCUIT AND METHOD FOR SETTING THE TIME DURATION OF A WRITE TO A MEMORY CELL

[75] Inventor: David C. McClure, Carrollton, Tex.

[73] Assignee: STMicroelectronics, Inc., Carrollton, Tex.

[21] Appl. No.: 09/020,430

[22] Filed: Feb. 9, 1998

Related U.S. Application Data

[62] Division of application No. 08/587,711, Jan. 19, 1996, Pat. No. 5,864,696.

[51] Int. Cl.$^6$ .......................................................... G06F 1/04
[52] U.S. Cl. ............................................. 713/500; 713/503
[58] Field of Search ..................................... 395/555, 558,
395/559; 371/5.4, 21.1, 21.2, 61, 62; 713/500,
503, 600; 714/767, 718, 719, 814, 815

[56] References Cited

U.S. PATENT DOCUMENTS

| | | | |
|---|---|---|---|
| 4,425,633 | 1/1984 | Swain | 365/194 |
| 4,430,735 | 2/1984 | Catiller | 371/25 |
| 4,510,603 | 4/1985 | Catiller | 371/21 |
| 4,962,487 | 10/1990 | Suzuki | 365/233.5 |
| 4,975,877 | 12/1990 | Bell | 365/189.01 |
| 5,258,952 | 11/1993 | Coker et al. | 365/194 |
| 5,267,197 | 11/1993 | McClure | 365/189.01 |
| 5,267,210 | 11/1993 | McClure et al. | 365/218 |
| 5,295,104 | 3/1994 | McClure | 365/210 |
| 5,300,828 | 4/1994 | McClure | 307/443 |
| 5,305,268 | 4/1994 | McClure | 365/203 |
| 5,311,467 | 5/1994 | Lysinger et al. | 365/189.01 |
| 5,313,650 | 5/1994 | Mitsuishi et al. | 395/800 |
| 5,396,108 | 3/1995 | McClure | 327/108 |
| 5,404,334 | 4/1995 | Pascucci et al. | 365/210 |
| 5,424,985 | 6/1995 | McClure et al. | 365/194 |
| 5,446,698 | 8/1995 | McClure | 365/230.03 |
| 5,692,216 | 11/1997 | Wolford et al. | 395/821 |

*Primary Examiner*—Dennis M. Butler
*Attorney, Agent, or Firm*—David V. Carlson; Theodore E. Galanthay; Lisa K. Jorgenson

[57] ABSTRACT

A circuit and method for varying the time of a write cycle. A variable timer circuit is provided coupled to a write simulation circuit. The write simulation circuit receives a signal from a start write sensing circuit indicating that data is being written to memory cells of the array. The write simulation circuit includes a memory cell replicate which replicates the time required for writing data to memory cells of the array. After the memory cell replicate has changed state, a signal is output via a switching circuit to the variable timer circuit for generation of a write termination signal. The memory cells are tested at various write cycle speeds by controlling the variable timer circuit. The variable timer circuit is set to terminate the write as quickly as possible after a successful write to the memory cells has been completed. The time interval for permitting a write can be selectively controlled over a large range to provide extremely fast devices or somewhat slower devices, all of which operate faster than standard devices on the market and thus are in high demand.

8 Claims, 14 Drawing Sheets

CIRCUIT AND METHOD FOR SETTING THE TIME DURATION OF A WRITE TO A MEMORY CELL

CROSS-REFERENCE TO RELATED APPLICATIONS

This application is a divisional application of an application entitled "Circuit and Method for setting the time duration of a write to a memory cell", filed Jan. 19, 1996, having a Ser. No. 08/587,711, and issued as U.S. Pat. No. 5,864,696.

The following pending U.S. Patent Applications by David C. McClure entitled: "Architecture Redundancy," Ser. No. 08/582,424, now U.S. Pat. No. 5,612,918, arid "Redundancy Control," Ser. No. 08/580,827, now U.S. Pat. No. 5,790,462, which were filed on Dec. 29, 1995, and have the same ownership as the present application, and to that extent are related to the present application, which are incorporated herein by reference; and entitled: "Test Mode Activation and Data Override," Ser. No. 08/587,709, "Pipelined Chip Enable Control Circuitry and Methodology," Ser. No. 08/588,730, now U.S. Pat. No. 5,701,275, "Output Driver Circuitry Having a Single Slew Rate Resistor," Ser. No. 08/588,988, now U.S. Pat. No. 5,801,563, "Synchronous Stress Test Control," Ser. No. 08/589,015, now U.S. Pat. No. 5,712,584, "Write Pass Through Circuit," Ser. No. 08/588,662, now U.S. Pat. No. 5,657,292, "Data-Input Device for Generating Test Signals on Bit and Bit-Complement Lines," Ser. No. 08/588,762, now U.S. Pat. No. 5,845,059, "Synchronous Output Circuit," Ser. No. 08/588,901, now U.S. Pat. No. 5,619,456, "Write Driver Having a Test Function," Ser. No. 08/589,141, now U.S. Pat. No. 5,745,432, "Circuit and Method for Tracking the Start of a Write to a Memory Cell," Ser. No. 08/589,139, now abandoned, "Circuit and Method for Terminating a Write to a Memory Cell," Ser. No. 08/588,737, now abandoned, "Clocked Sense Amplifier With Word Line Tracking," Ser. No. 08/587,728, now U.S. Pat. No. 5,802,004, "Memory-Row Selector Having a Test Function," Ser. No. 08/589,140, now abandoned, "Synchronous Test Mode Initialization," Ser. No. 08/588,729, now U.S. Pat. No. 5,767,709, "Device and Method for Isolating Bit Lines from a Data Line," Ser. No. 08/588,740, now U.S. Pat. No. 5,691,950, "Low-Power Read Circuit and Method for Controlling a Sense Amplifier," Ser. No. 08/589,024, now U.S. Pat. No. 5,619,466, and "Device and Method for Driving a Conductive Path With a Signal," Ser. No. 08/587,708, now abandoned, and by Mark Lysinger entitled: "Burst Counter Circuit and Method of Operation Thereof," Ser. No. 08/589,023, now abandoned, all of which have the same effective filing date and ownership as the present application, and to that extent are related to the present application, which are incorporated herein by reference.

FIELD OF THE INVENTION

This invention is related to a method and apparatus for controlling a write to a memory cell and in particular to a method and apparatus for setting the time duration of a write to a memory cell.

BACKGROUND OF THE INVENTION

Computer processors are increasingly becoming more complex and capable of performing many tasks simultaneously. At the same time, computer processors are now operating at higher speeds and able to input and output greater amounts of data. At the same time, the voltage level of which computer processors and other devices has decreased. For example, many computer processors today use a full 32 bit bus for data input and output while operating at very high speeds. The voltage requirement is also reduced from 5 volts to lower voltages, such as 3.3 volts, are lower. There is therefore a need for memory devices which are capable of transferring 32 bits of data simultaneously while at the same time operating at very high speeds and at lower voltage levels. The high speed of operation is required not only for reading data from the memory devices but also for writing data to the memory devices under control of the microprocessor.

At low supply voltages, for example 3.3 V and lower, correctly writing data to a memory cell is subject to more sensitivity than at higher supply voltages, such as 5 V. In addition, writing to memory cells at a lower voltage may require more time than writing at a higher voltage and may also require more time than reading data from the same memory cell.

At lower voltages, the body effect of a transistor has a greater affect on the operation of the transistor itself. In addition, the threshold voltage becomes a higher percentage of the total supply voltage when operating on a lower supply voltage. Because of these, and many other factors, the voltage available for storing data using a lower supply voltage is much less than is available when operating at the higher supply voltages.

A further problem with operating at lower voltages is that the speed at which data can pass through a transistor while the transistor is being turned ON is reduced because both the gate voltage and the data voltage are reduced from that which would be available at a higher voltage.

Even minor variations from one memory device to another may affect the time required to store data in seemingly identical memory cells. For example, even using the same manufacturing process, the bit line resistance may vary from one lot to another. Further, the contact resistance, whether buried contact or via, may vary slightly from one lot to another. Variations in the properties of the active areas, such as the bird's beak, the threshold voltage and the body effect may also cause variations in the time required to write data to a memory cell. At lower voltages, even very slight changes in any one of these parameters will affect the speed at which data can be correctly written to the memory cell.

According to the prior art, the time permitted to perform a write to a memory cell was established according to the product specifications for a given product design. Enough time was provided to ensure that data was written to the properly manufactured memory cell. If data cannot be correctly written to the memory cell in the time established by the specifications, the entire memory chip is deemed defective and cannot be sold. By establishing the product specifications at a long write time, the number of defective chips is reduced. However, this results in a slower speed of the memory devices. As faster and faster computer processors become available, the speed at which memory can be accessed is an important parameter for the commercial success of the memory on the market. It is therefore desirable to provide a memory in which data can be written to as quickly as possible while at the same time providing a memory which meets product specifications so that the chips do not need to be discarded.

SUMMARY OF THE INVENTION

According to principles of the present invention, a variable timer circuit is provided for setting the length of a write to a memory cell at a selected time interval. A start write sensing circuit is coupled to a write simulation circuit to simulate the amount of time required for writing to the memory cell. The write simulation circuit outputs a signal to the variable timer circuit via a switching circuit. The variable timer circuit can shorten the time interval for a write by advancing the write termination signal. Alternatively, the variable timer circuit may delay the write termination signal to lengthen the time interval of a write to memory cells in the array.

A write termination circuit is coupled to various parts of the memory array for generating a termination signal to terminate a write.

According to a first embodiment of the present invention, the write simulation circuit includes a memory cell replicate for simulating the amount of time required to write data to a memory cell in the array. Upon the state of the data in the memory cell replicate being switched, a signal is output to the switching circuitry for presentation to the variable timer circuit. The variable timer circuit includes a plurality of transistors in parallel with the switching circuit to provide an additional current path to ground and speed up the generation of the write termination signal. The variable timer circuit also includes a series of delay gates for delaying the generation of the write termination signal.

During testing of the memory device, the speed at which data can be written to the memory is determined by repeated writing to the memory cells using different time intervals for the write. If data can accurately be written to the memory cell using a short write cycle, the variable timer circuit is set in a fast time mode to advance the time for the generation of the write termination signal and thus shorten the write time interval. This significantly speeds up the writing to the array.

If, on the other hand, the testing of writing to the memory cells of the array indicates that data is only successfully written on a longer write time interval, the slow time mode is enabled to lengthen the time write interval. The generation of the write termination signal is delayed to lengthen the time interval for such a write. In one embodiment, once the fastest write time interval which ensures a correct and accurate write of data to the memory cells is determined, the write interval for that particular memory device is permanently set. This can be achieved by blowing a fuse, as a final middle step or by some other technique. In one alternative embodiment, an additional pin available to the users provided for permitting the user to set the length of the time write interval at various speeds.

During the testing mode, the time interval for the write cycle is varied over a range of times to determine the fastest possible time for accurately writing data to the memory cell.

The present invention provides the significant advantage that the write cycle can be shortened and thus a higher speed memory device can be provided if the device is able to meet the higher speed specifications. On the other hand, if the memory device does not meet the high speed specifications, it may still be set to meet the regular speed or slower speed specification and still be considered sufficiently fast to have significant commercial value. Previously, devices which were so slow as to not meet the specification had to be discarded. According to principles of the present invention, a bin sort can now be performed during test to place the memory devices in separate categories according to their speed. A number of devices can be placed in the high speed bin and thus satisfy a great demand in the marketplace. Devices which are not sufficiently fast to meet the highest speed category are still very fast chips and are sold for use in those systems which do not demand the highest speeds possible. With the present write simulation circuit as described herein, even the slowest devices are faster than many prior art devices and thus will satisfy significant demand in the marketplace.

DETAILED DESCRIPTION OF THE INVENTION

Figure 1:
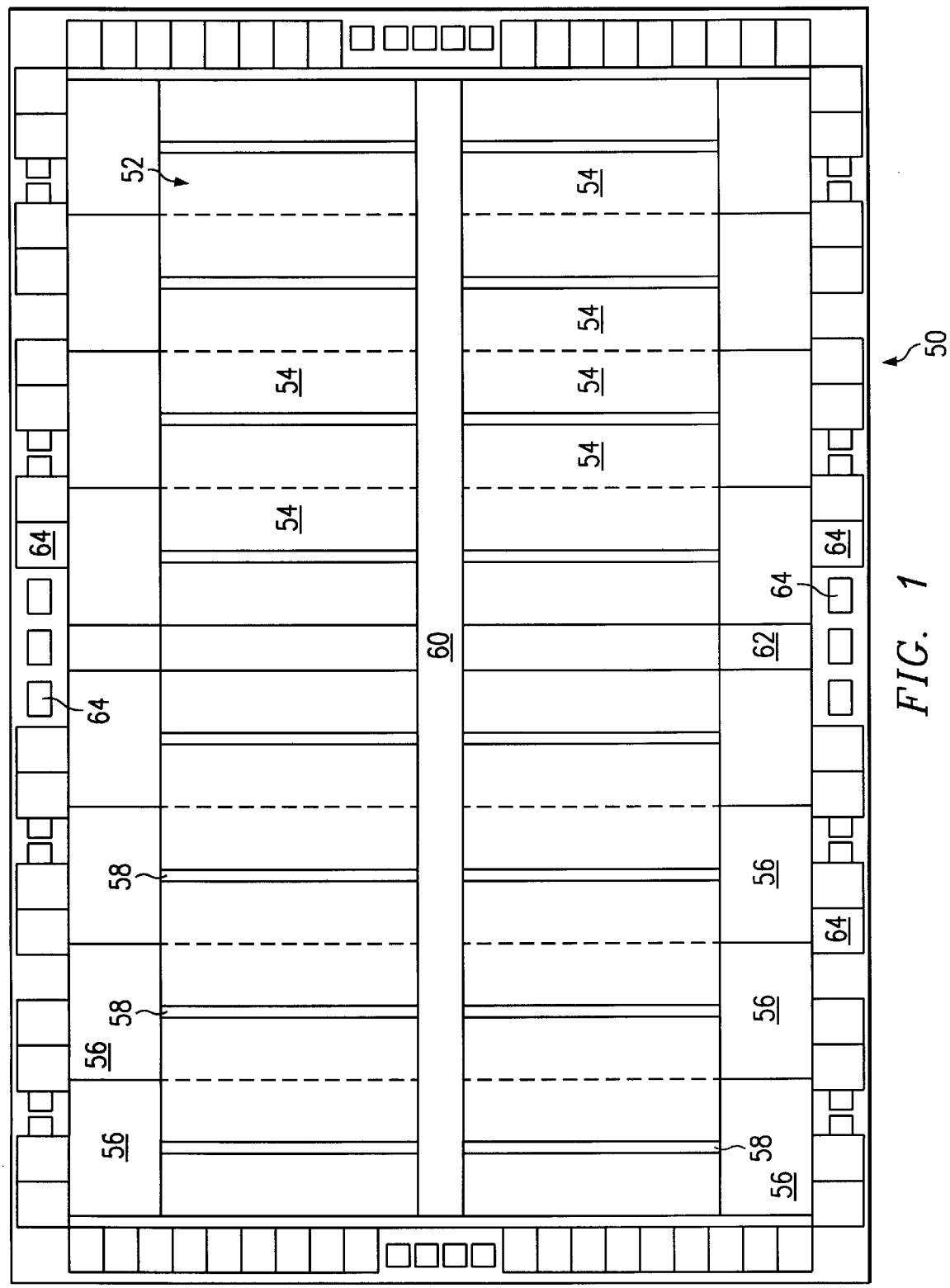
FIG. 1 is a memory device having a memory array thereon.

FIG. 1 shows a memory device 50 having a memory array 52 thereon. The memory array 52 is subdivided into a plurality of memory array blocks 54. The memory array is subdivided into as many memory array blocks as desired, according to the design. For example, eight blocks, nine blocks, or 16 blocks are rather common numbers of array blocks. In one embodiment, 32 memory array blocks 54 are formed. as is shown in FIG. 1. The 32 blocks are grouped into four quadrants; each quadrant having eight blocks. There are four quadrants on the memory device 50.

Associated with each memory array block 54 is the respective block input/output circuitry 56 and word line drive circuitry 58. In one embodiment, the word line drive circuitry 58 for two blocks of memory is positioned in a single region between the two adjacent memory blocks 54. Alternatively, it can be located in the central or peripheral regions of the device 50. Other circuitry for accessing the cells in the array, such as the row and address decoders, input/output buffers and sense amplifiers are located in the block I/O circuitry 56, the central regions 60 and 62 and other positions on the device 50 as needed. A plurality of bonding pads 64 are provided in the peripheral region of the chip for connecting to data input/output pins, voltage supply lines, address lines and other electrical connections as needed for the memory device 50.

Figure 2:
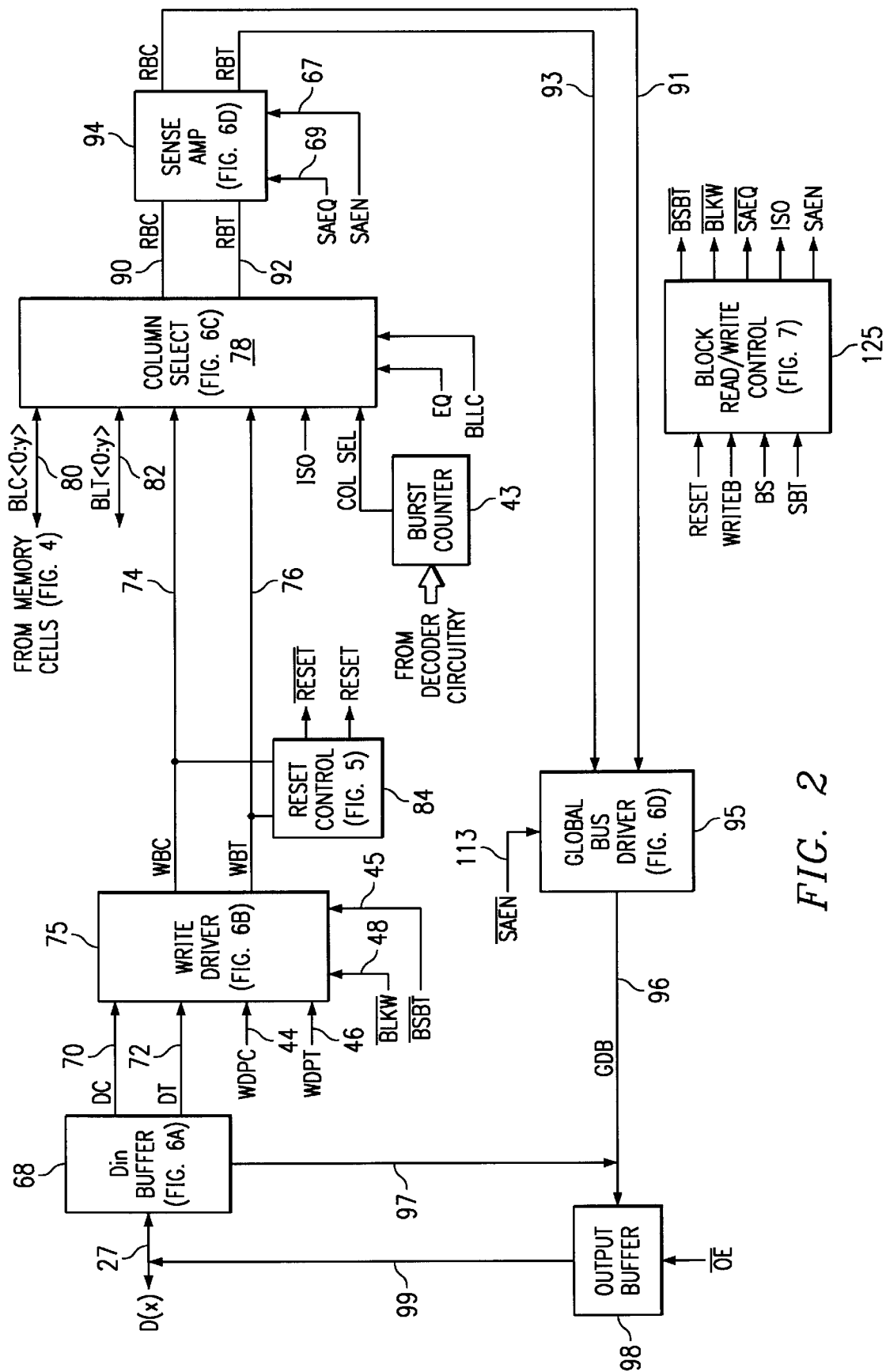
FIG. 2 is a block diagram of various circuits on the memory device of FIG. 1.
Figure 3:
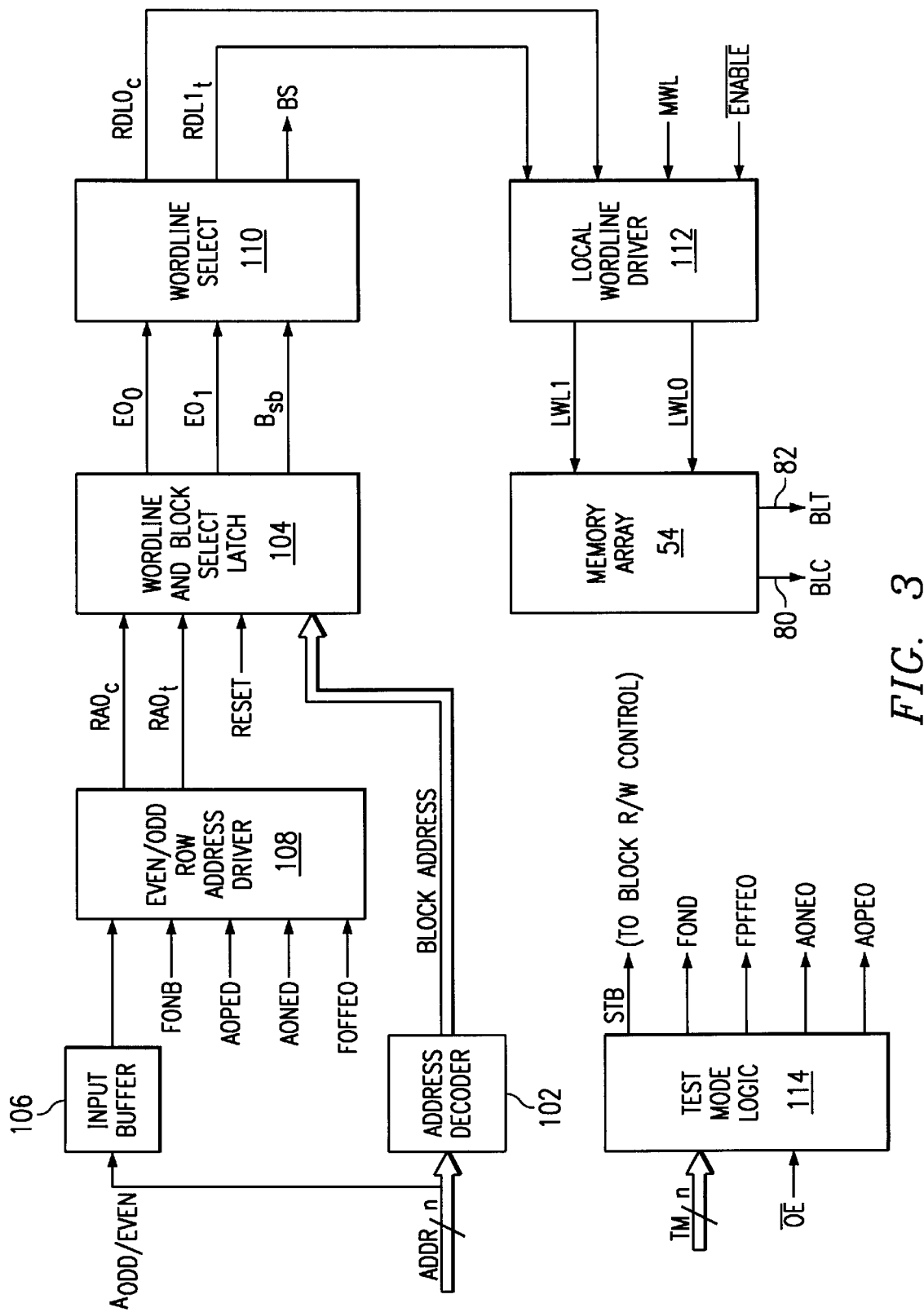
FIG. 3 is a block diagram of additional circuits on the device of FIG. 1.

FIGS. 2 and 3 illustrate block diagrams for various circuitry as found on the memory device 50. Each block of memory array 54 is provided with circuitry for providing data to and from for that individual block. In one embodiment, the circuitry of FIGS. 2 and 3 will be provided for each block 54 so that there are 32 such circuits on a single device 50. Alternatively, for that circuitry which can be shared between two blocks 50, only 16 such circuits will be needed, as will be apparent to those of skill in the art. In one embodiment, the memory device 50 is capable of receiving 32 bits of data simultaneously and outputting 32 bits of data simultaneously. Therefore, all circuitry required to input and output 32 bits of data simultaneously is provided, such as 32 input/output buffers, and the like. The 32 bits can be provided by simultaneously accessing one memory cell in each of the 32 blocks or, alternatively, by accessing 8 memory cells in one block within one quadrant and accessing four blocks one within each quadrant simultaneously. The circuits shown in FIG. 2 and FIG. 3 are thus provided for each individual block of memory array 54 and can have a 1 bit bus, an 8 bit bus, a 4 bit bus or the like.

As shown in FIG. 2, a data signal line 27 receives data and provides the data to input buffer 68. The data input buffer 68 outputs the data complement DC, on a signal line 70 and the data true DT, on a signal line 72. The input buffer is shown and described in more detail with respect to FIG. 6A.

A write driver 75 receives the data and outputs the data on signal lines write bit complement, WBC 74 and write bit true, WBT 76. The data input buffer also outputs the written data to an output buffer 98 on line 97.

The signal lines WBC 74 and WBT 76 are input to a column select circuitry 78. The column select circuitry 78 outputs the data on bit line complement BLC 80 and bit line true BLT 82 for writing to the memory array. The BLC line 80 and BLT line 82 are connected to the memory array block 54 as shown in FIG. 3. The WBC and WBT signal lines 74 and 76 are also connected to a reset control circuit 84 which outputs signal lines reset 86 and reset bar 88. Reset control circuit 84 receives additional input signals as explained in more detail with respect to FIGS. 5, 8A and 8B.

Figure 6A:
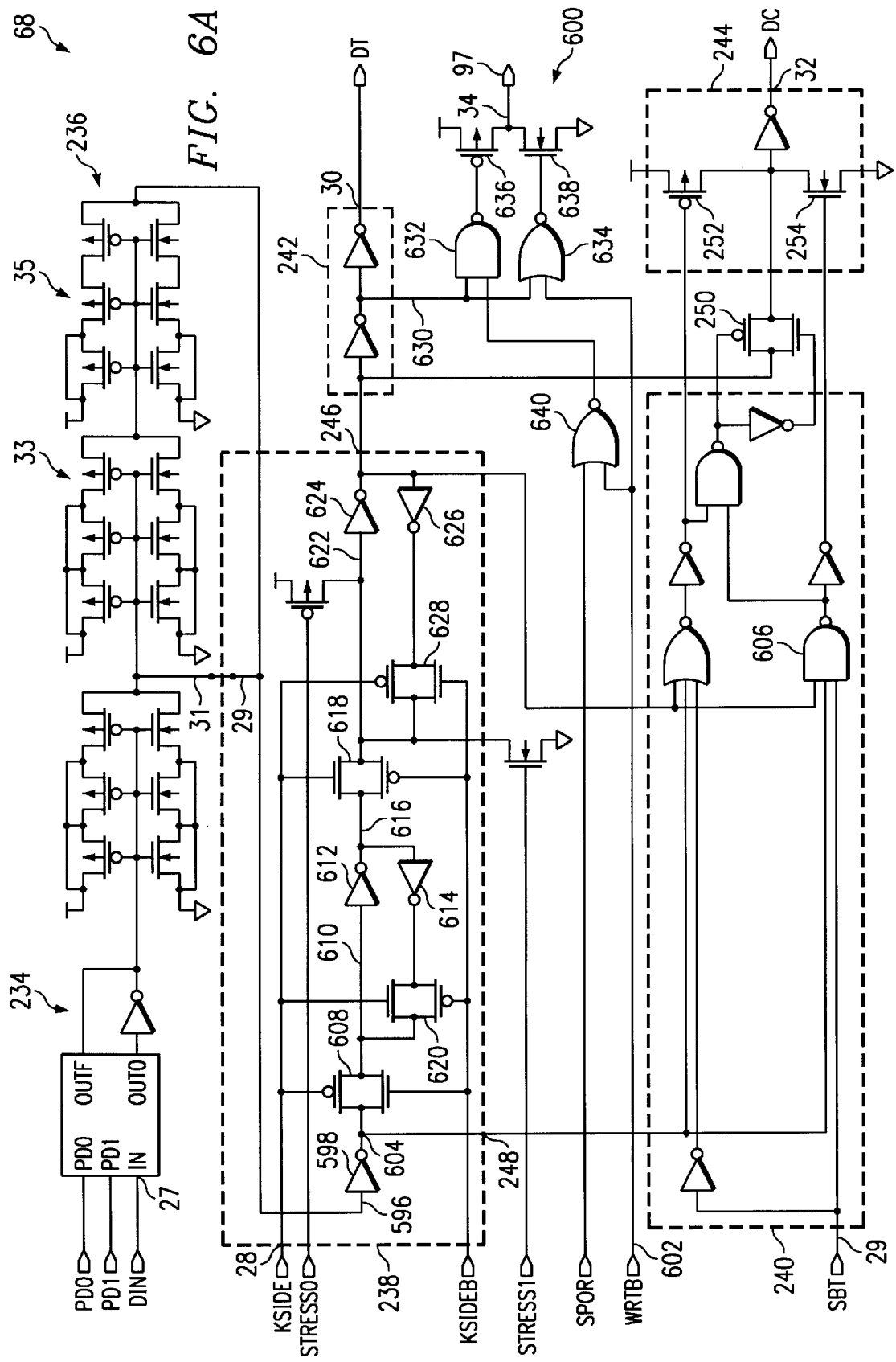
FIG. 6A is a detailed schematic of the input buffer as shown in FIG. 2.
Figure 6B:
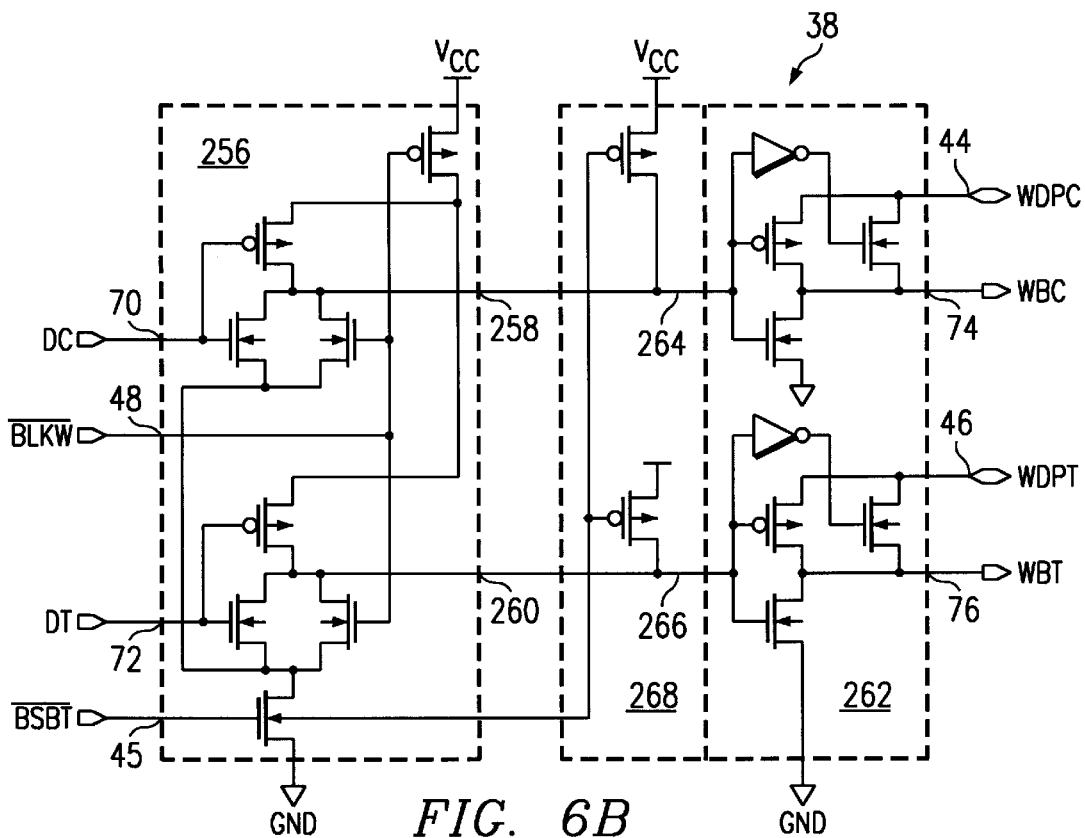
FIG. 6B is a detailed schematic of the write driver circuit as shown in FIG. 2.

The write driver circuit 75 also receives additional input signals as explained in more detail with respect to FIG. 6B.

Figure 7:
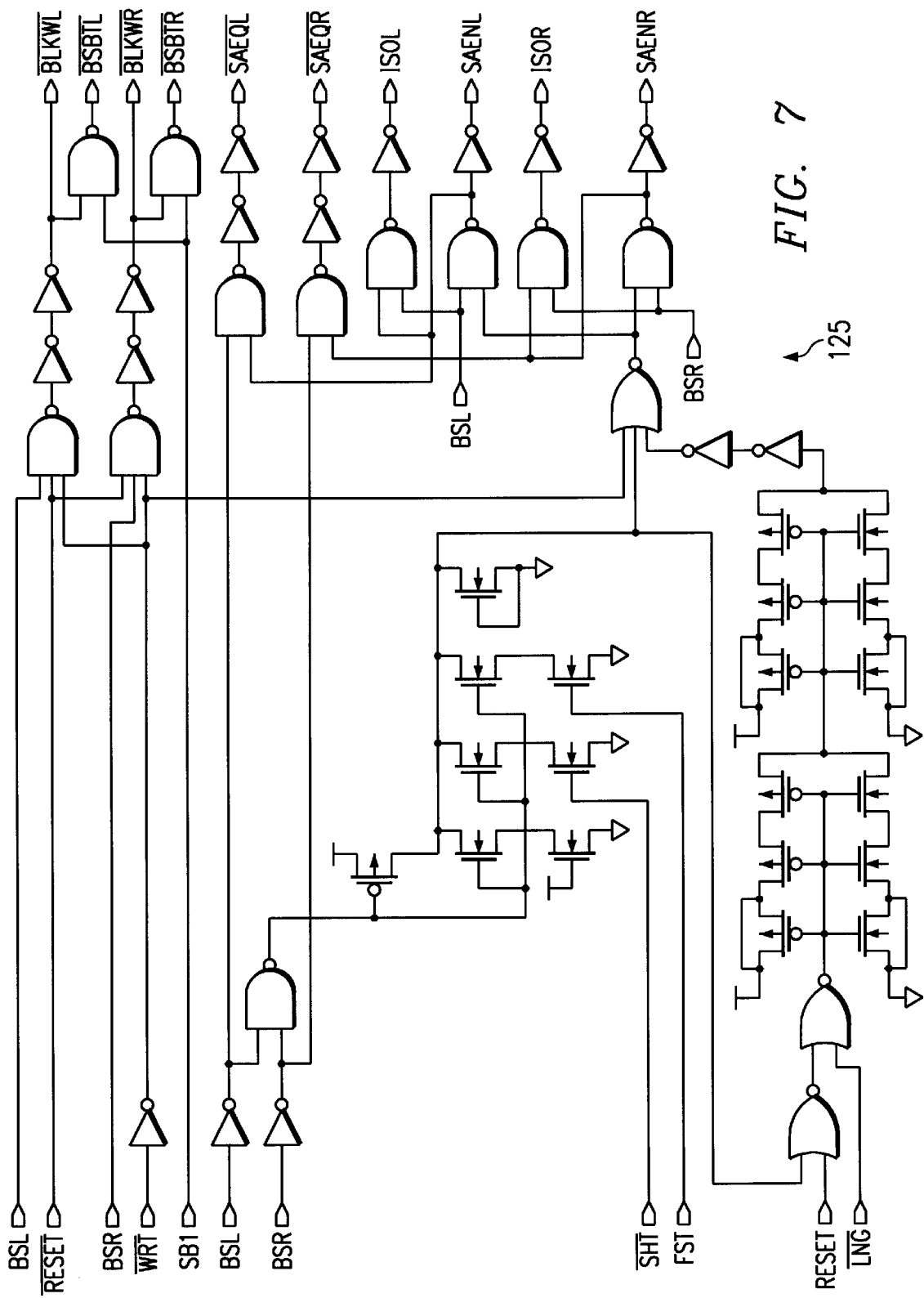
FIG. 7 is a detailed schematic of the block read/write control of FIG. 2.

The column select circuit 78 also receives additional input signals to control reading and writing data to and from the memory array block 54 as explained in more detail with respect to FIG. 7.

Read bit complement RBC 90 and read bit true RBT 92 signal lines are output by the column select circuitry 78 and carry the read bit data when the circuitry is in the read mode. RBC 90 and RBT 92 are input to the sense amp circuitry 94 which also receives additional signals as explained in more detail with respect to FIG. 6C. Sense amp circuit 94 outputs signal lines RBC 90 and RBC 92 to a global bus driver circuitry 95. A global drive bus signal line, GDB 96 is connected to the global bus driver 94 and also connected to an output buffer 98 to provide output of the data on data line 27. A read/write control circuitry 125 receives a number of input signals and outputs additional signals to control the reading and writing of data to and from the memory array block 54 as explained in more detail with respect to FIG. 6C.

FIG. 3 illustrates block diagrams of additional circuitry associated with the memory array blocks 54. In particular, an address decoder 102 receives address information and outputs address information to the word line and block select latch circuit 104. Additional address decode circuitry including an input buffer 106, an even/odd row address driver 108 and a word line select circuit 110 are part of the address decode circuitry. The word line select circuitry provides signals to the local word line driver circuitry 112 which outputs signals to drive the individual word lines of the memory array block 54 as shown in FIG. 3. As will be appreciated, the appropriate address decoder circuitry for the column address is also provided so that individual memory cells are accessible. Test mode logic 114 is also provided to permit testing of the memory device 50. Any acceptable circuits for the blocks of FIG. 3 may be used as is known in the art, the structure and operation of these circuits is not part of the present invention.

Figure 4:
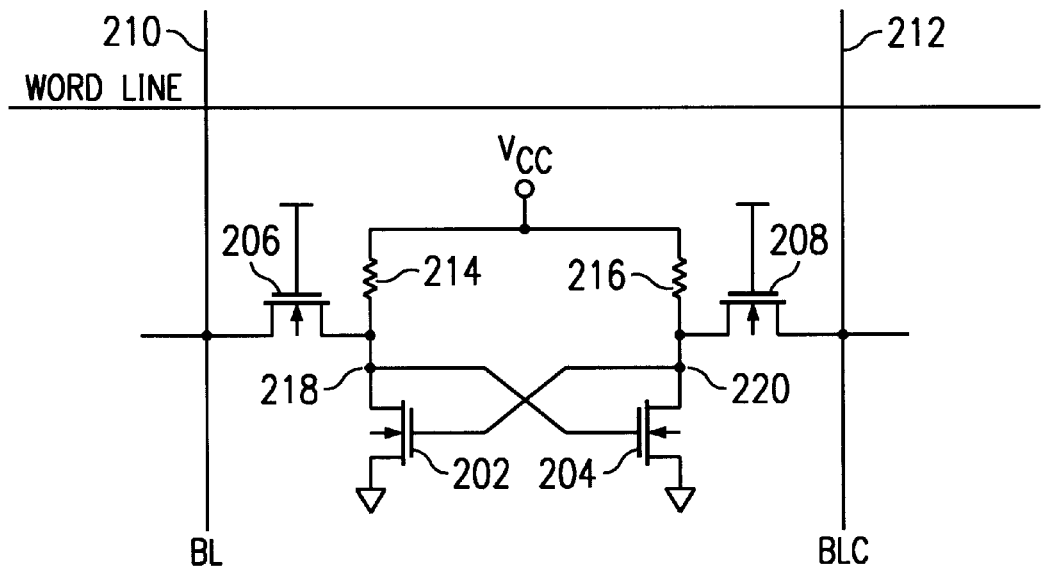
FIG. 4 is a circuit schematic of a memory cell.

FIG. 4 is a circuit diagram of a memory cell within the memory array blocks 54 for storing data according to one embodiment of the invention. In this embodiment, the memory cell is a four-transistor static memory cell and the device 50 is an SRAM. The SRAM memory cell includes two cross-coupled transistors 202 and 204 and two access transistors 206 and 208. A bit line BL 210 is connected to one access transistor and a bit line complement BLC 212 is connected to the other access transistor. The respective drains of the cross-coupled transistors 202 and 204 are connected to voltage supply through poly resistors 214 and 216. Memory cells of this type are well-known in the art and any current technique and process for forming such memory cells is acceptable. In an alternative embodiment, the memory cell according to the invention is a DRAM memory cell having a single access transistor and a capacitor for the data storage node. In further alternative embodiments, the memory storage device is a non-volatile memory, such as an EEPROM, a flash EEPROM or the like.

Data is stored at nodes 218 and 220, node 218 being true data and node 220 being complement data. During a write, bit lines 210 and 212 must always write opposite data states to the memory cell, one bit line writing true data and the other bit line writing complement data to the respective true and complement storage nodes.

Figure 5:
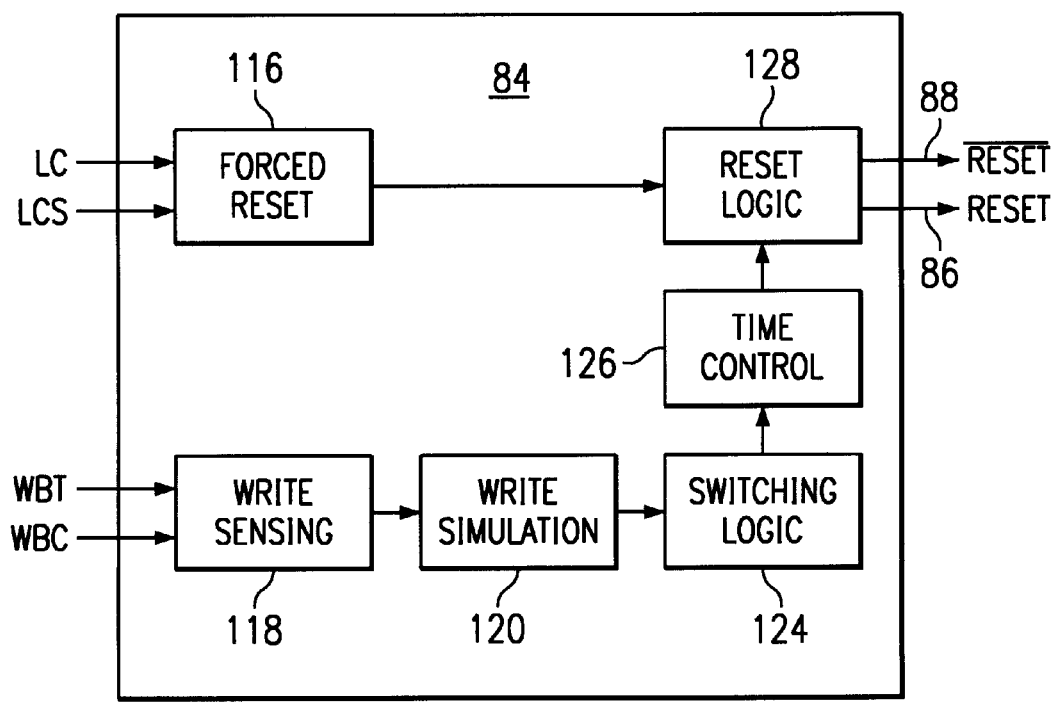
FIG. 5 is a block diagram of the reset control circuit of FIG. 2.

FIG. 5 is a more detailed block diagram of the reset control circuit 84 as shown in FIG. 2. The reset control circuit 84 outputs reset signal 86 and reset bar signal 88 to signal termination of a write to a memory cell as explained in more detail herein.

Figure 8A:
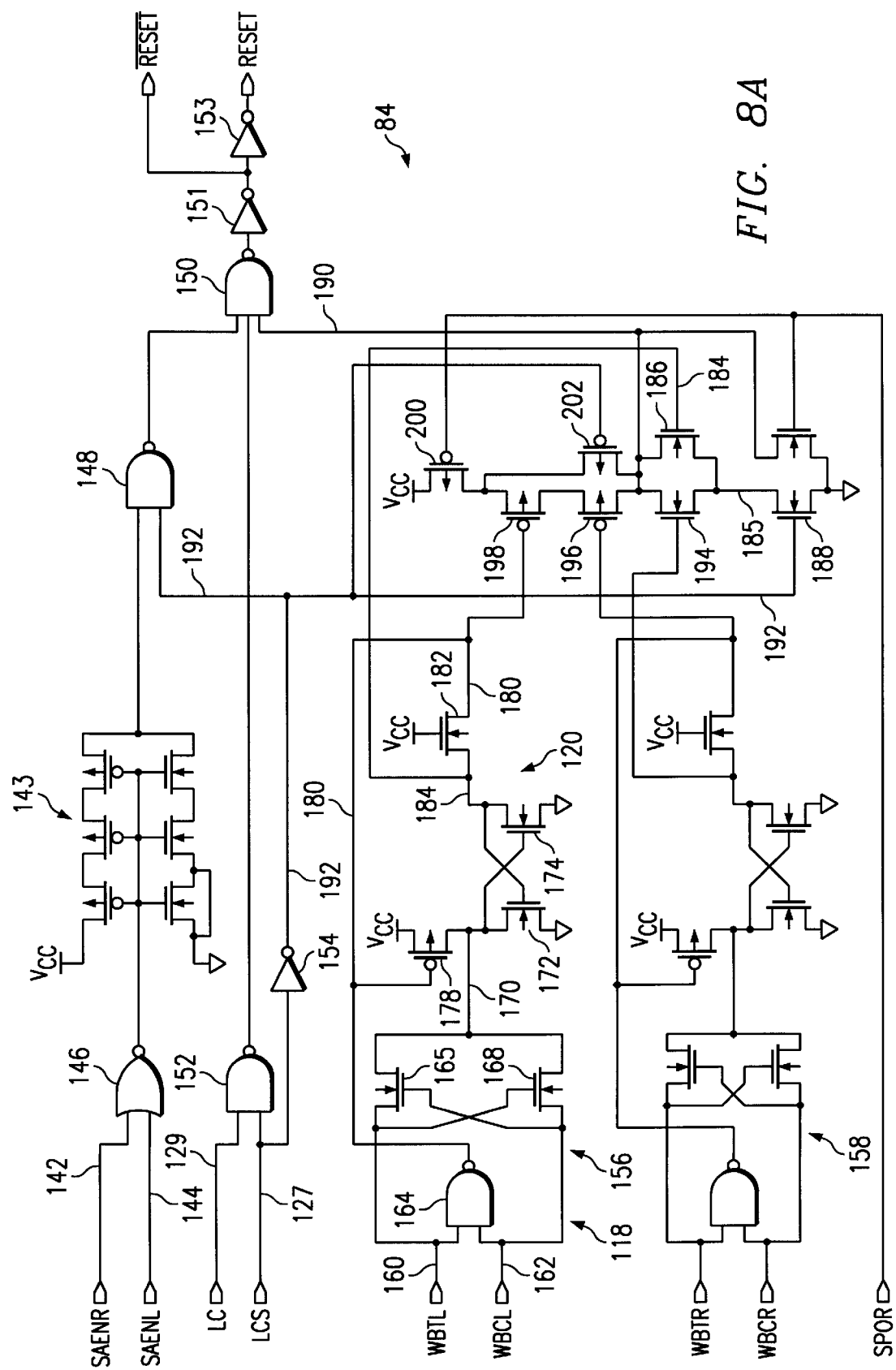
FIG. 8A is a detailed schematic of one embodiment of the block reset control circuit of FIG. 5.
Figure 8B:
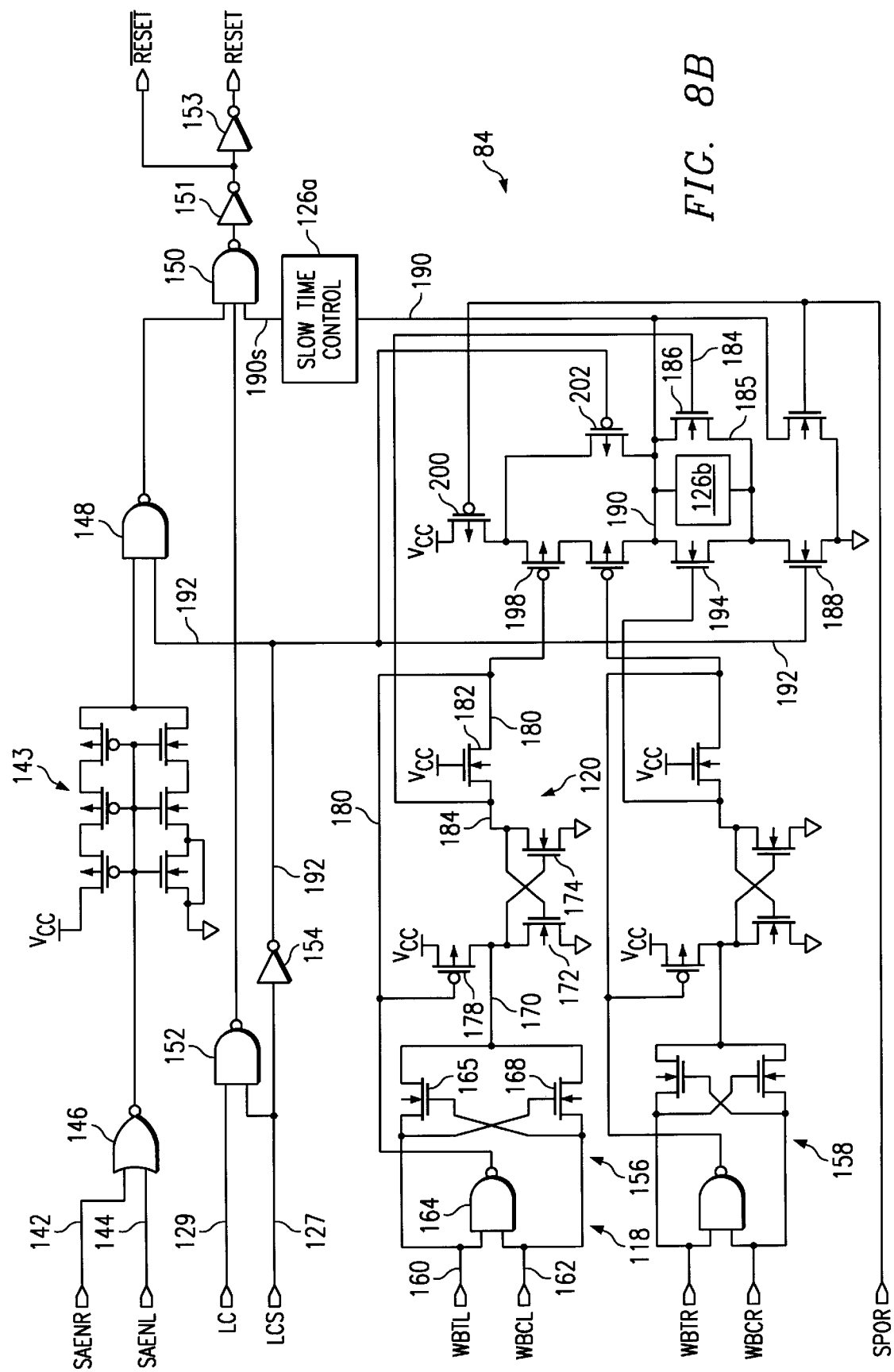
FIG. 8B is a detailed schematic of a second embodiment of a block read/write control circuit with write timing control circuitry.

The reset control circuit 84 receives signals from other circuits in the array in order to generate reset signal RESET 86 and reset bar signal RESET B 88. In one embodiment, as shown in FIGS. 8A and 8B, the reset control circuitry 84 contains circuitry for two memory array blocks 54 and thus can control the resetting of two adjacent memory blocks 54. In an alternative embodiment, one reset control circuit 84 is provided for each block of memory as shown in FIG. 5. In a further alternative embodiment, one reset control circuit is provided for each 8 blocks of memory so that one quadrant of the memory device 50 is controlled by one block. Further, the entire chip can be controlled by one reset block so that the termination of the write cycle for an entire chip is controlled from a single circuit according to the invention. In preferred embodiments, the reset control circuitry is provided for each memory array block 54, or alternatively for each pair of memory array blocks, so that each block of memory is individually controlled for termination of a write to a memory cell within that particular block. The reset circuitry 84 includes forced reset logic 116, write sensing circuit 115 and write simulation logic 120. The write simulation circuit 120 output is connected to the switching logic 124 which is connected to the time control circuit 126. The time control circuit 126 is connected to the reset logic 128 which ultimately outputs reset signal 86 and reset bar signal 88.

FIG. 6A shows a detailed schematic of the data input buffer 68 from FIG. 2. As shown, the data input buffer 68 receives data on line 27 and includes input circuitry 234, delay circuitry 236, a latch circuit 238, a test logic circuit 240, a first driver 242, and a second driver 244. As shown, the input circuitry 234 receives the data signal and couples it via the delay circuit 236 to the latch circuit 238. The memory circuit has an output terminal 246 that couples the data to both the input terminals of the drivers 242 and 244. The latch circuit 238 has a second output terminal 248 that couples the data to the test circuit 240. During a normal mode of operation, the latch circuit 238 couples the data to the input of the driver 242 and to the input of the driver 244 via switch 250 which during normal operation is closed. Both the transistors 252 and 254 of the driver 244 are open such that the data from the memory circuit is coupled via the switch 250 directly to the driver 244. As shown, during normal operation the driver 242 has an even number here two of inverters while the driver 244 has an odd number here one of inverters. Thus, during normal operation, the signals DT and DC must be complementary to one another.

The data input buffer 68 also contains a write global bus driver 600 for placing write data onto the read global data bus 96 via bus line 97 as shown in FIG. 2. The data input buffer thus acts as a write pass through circuit tor passing write data directly to the output buffer 98 during each write cycle.

As shown in FIG. 6A, data is input at terminal 27 through a standard TTL input buffer of a type well known in the prior art. The output of TTL buffer 27 is data complement. The data in the form of data complement is then transferred to node 596 and, passing through inverter 598, is placed on node 604. The data is input to NAND gate 606 and simultaneously is presented to transfer gate 608. When the clock kSIDE goes low, transfer gate 608 is enabled to provide the data on node 604 to the input 610 of a master latch having inverter 612 and 614. The output terminal 616 of the master latch is presented to the transfer gate 618. A transfer gate 620 provides a feedback path from the output of inverter 614 to the input of inverter 612. The output of the transfer gate 618 is connected to the input 622 of a slave latch having inverter 624, inverter 626 and transfer gate 628. The output 246 of the slave latch is provided to the first output driver 242 and also to the second output driver 244. On node 630, data complement from the first driver 242 is input to NAND gate 632 and NOR gate 634. The output of NAND gate 632 drives a first transistor 636 and the output of NOR gate 634 drives a second transistor 638. These two transistors 636 and 638 comprise a write global bus driver 600 which places the write data onto the global data bus 96 via write data transfer bus 97 during each write cycle.

In one embodiment, lines 29 and 31 are not connected so that delay stages 33 and 35 are used. Alternatively, lines 29 and 31 are connected and delay stages 33 and 35 are bypassed.

In one embodiment, only data compliment is provided on the global data bus 96 via terminal 34. In an alternative embodiment, both true data and complement data are provided, with terminals 30 and 32 connected to the GDB 96 via tristate drivers coupled to bus line 97.

The write bar signal WRTB on line 602 is input to NOR gate 640 whose output is connected as the other input to NAND gate 632. WRTB bar line 602 is directly connected as the other input to NOR gate 634.

The operation of FIG. 6A during a write cycle will now be described. During a write cycle, data is provided to input terminal 27 at a selected rate. During a write, signal SPOR is low and signal write bar WRTB on line 602 is also low the entire time during a write cycle. Both inputs to NOR gate 640 are low so the output of NOR gate 640 is high and one input to NAND gate 632 is high. Also, with WRTB in low, one input to NOR gate 634 is low.

When data is presented at input terminal 27, after a brief delay, the complement data signal is present at node 596 and data is at node 604. If lines 31 and 29 are coupled, the complement data signal will more quickly appear at node 596. When clock kSIDE goes low, the data is transferred from node 604 to node 610 and data subsequently is provided at node 616. kSIDE stays low a sufficient time to permit the data to stabilize at node 616, which usually happens very quickly. This is the first phase of the clock kSIDE. At the second phase of the cycle of the clock kSIDE, the clock transitions to high which disables transfer gate 608 and enables transfer gates 618 and 620. At the same time, kSIDEB goes low to disable transfer gate 608 and enable transfer gate 618 and 620. With transfer gate 620 enabled, the feedback loop from latch 614 is completed so that the state of node 610 is held constant. The data at node 616 complement is transferred out to node 622 and, a very short time later appears at node 246 as data.

The data is then presented to node 630 which is one input to NAND gate 632. The other input to NAND gate 632 is high so therefore the state of the data other input controls the state of the output of NAND gate 632. Namely, if the data presented is a high, the output of the NAND gate is a low, which turns on transistor 636 to drive terminal 34 high to place a high on the global data bus. Conversely, if node 630 is low, then a 0 is at NAND gate 632 which places a 1 on the output to turn off transistor 636.

At the same time, the 0 is presented to NOR gate 634 which, since the other input is already 0, provides a 1 at the output of NOR gate 634 to turn on transistor 638. Turning on transistor 638 places a 0 on the global data bus at terminal 34. Thus, the state of the complement data, whether high or low will be transferred from the first driver circuit 242 onto the global data bus during a write of the data. All data written to the global data bus is actually the data complement, so it could be viewed as the global data bus bar. As is known in the art, data or its complement may easily be obtained from the other using an invertor.

When a write is not being performed. WRTB is taken high on line 602. With one input to NOR gate 640 high, the output is always held low regardless of the other state of the input, so that the output to NAND gate 632 is always held high to permanently turn off transistor 634. At the same time, one of the inputs to NOR gate 634 is held high to ensure that the output is always low to turn off transistor 638. The write global bus driver 600 is therefore disabled. No output can be provided at terminal 34 and it presents a high impedance state to any signal which is attempted to be provided the input. Thus, when a write is not being performed, line 97 is disabled to either output data or input data.

The write driver bus 600 has the same structure and operational characteristics as the global data bus driver 95. The transistors of the write global data bus driver 600 are made sufficiently large to drive the global data bus. Typically, they are approximately half the size of the transistors 332 and 334 of the global bus driver 95 explained in greater detail herein. The transistors are made sufficiently large to drive the output buffer 98 with the write data while a write is being performed.

In summary, when an address is presented on the address bus to write data, data is written to that address along the path as described herein from the data input buffer, the write driver through the column select and into the memory array. Simultaneously, the data input buffer provides the write data very quickly and efficiently onto the global data bus 96 through the global write driver 600 from the data input buffer. A very simple, yet fast and efficient circuit is provided for placing the write data on the read global data bus 96 simultaneously with it being written into the memory array. The write data stored in the memory array is then input to the first stage of the output buffer so that on the subsequent read cycle, the data that was previously written to the memory array is provided as the output of the output buffer 98 on the first read cycle.

As explained with respect to the output buffer 98, the data is output onto data line 27 in a pipelined fashion. That is, during a read when a first address is provided to the memory array for reading data, the data is propagated out of the array to a first pipeline stage in output buffer 98. The most recently written data was previously stored in the first pipeline state of output buffer 98 and thus, during the first read cycle the most recently written is transferred to the second pipeline stage of output buffer 98 and provided as the output on line 99. On the subsequent read cycle, the data stored at the address presented at the first read cycle is moved to the next pipeline stage of the output buffer 98 and provided as the output and the data stored at the address presented at the second read cycle is placed in the first pipeline stage of the output buffer 98. During the third read cycle, the data stored at the address presented at the second read cycle is output and so on, the general concept of a pipeline output buffer being well known in the art.

FIG. 6B is a schematic diagram of one embodiment of the write driver 78 of FIG. 2. The write driver 78 has an input stage 256 that has input terminals coupled to the input terminals 40, 42, 48 and 45 as shown. The input stage 256 has two output terminals 258 and 260, respectively. The input stage is also coupled to a power supply VCC via a first power supply terminal and ground via a second power supply terminal. An output stage 262 has a pair of input terminals 264 and 266 that are respectively coupled to the output terminals 258 and 260 of the input stage 256. The output stage 262 has write power and write-complement power terminals coupled to terminals 46 and 44 respectively of the write driver 38. The output stage 262 also has output terminals coupled to the output terminals 74 and 76 of the circuit 38. A test mode stage 268 has an input terminal coupled to the input terminal 50 and has a pair of output terminals that are respectively coupled to the enable terminals of the output stage 262, which in this embodiment are the input terminals 264 and 266.

During a write cycle, the signal $\overline{\text{BSBT}}$ is inactive high and the signal $\overline{\text{BLKW}}$ is active low. Thus, both the input and output stages 256 and 262 are enabled such that the output circuit 262 drives the lines 74 and 76 with the proper signals to write the proper data value to the selected memory cell. For example, if the signal DC is a logic low and the signal DT is a logic high to indicate a data value of logic 1, then the output circuit 262 generates the signal WBC a logic low and for the signal WBT a logic high. During a read cycle, the signal $\overline{\text{BLKW}}$ is inactive high, which causes the output stage 262 to drive both signals WBC and WBT to a logic high level by coupling the terminals 52 and 54 to the WDPC and WDPT lines respectively, regardless of the state of the signals DC and DT.

Although a specific schematic diagram is shown for the write driver 75, the driver 75 may include other specific circuit arrangements to perform the same function, that is, to decouple the WDPC and WDPT lines from the respective WBC and WBT lines 74 and 76, respectively, when the write driver circuit 75 is associated with an unselected memory block 54 during a single cell test mode.

Figure 6C:
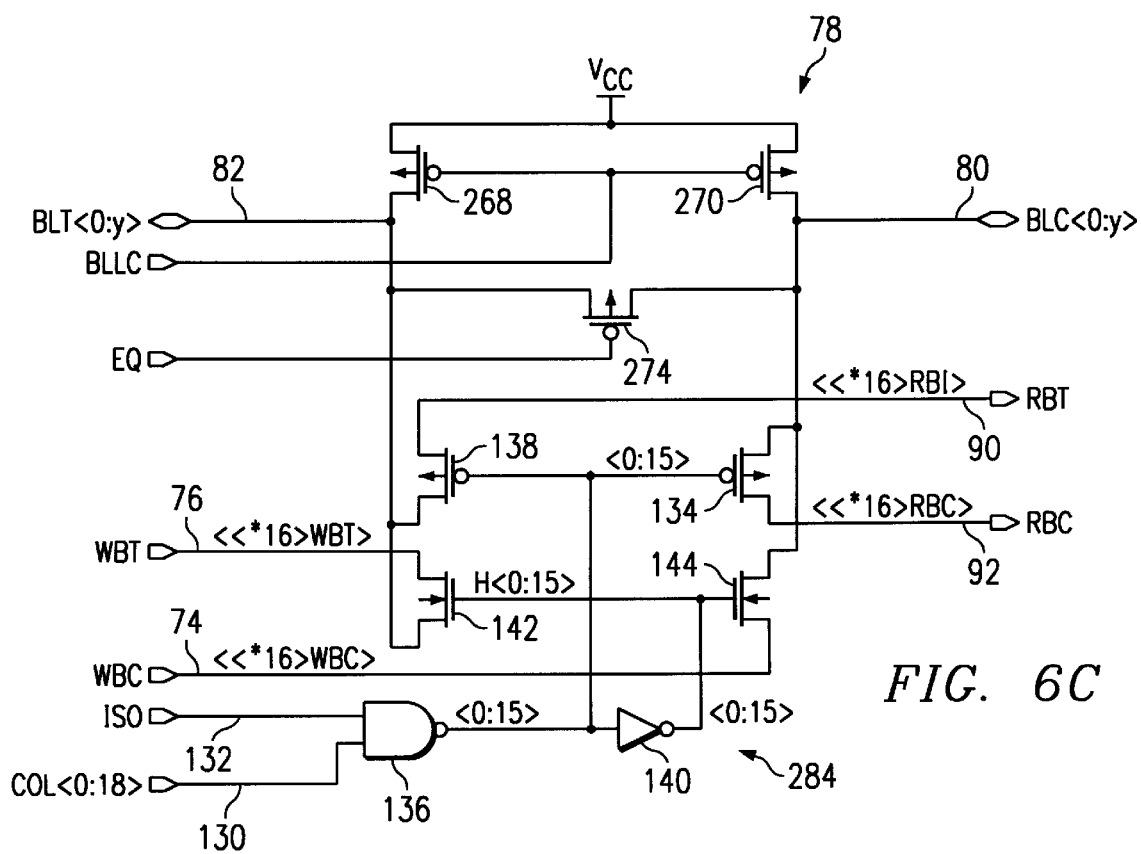
FIG. 6C is a detailed schematic of the column select circuit of FIG. 2.

FIG. 6C is a schematic diagram of one embodiment of the column select circuit 78 of FIG. 2. One set of circuitry is shown for a single pair of BLT 82 and BLC lines 80, it being understood that similar circuitry is included for the remaining Y–1 pairs of BLT and BLC lines. As shown, the circuit 78 includes a pair of active load transistors 268 and 270 that, when activated couple the associated BLT and BLC lines 82 and 80 to the power-supply voltage VCC via a power-supply terminal 272. An equilibrate transistor 274 is coupled between the BLT and BLC lines 82 and 80. A pair of read pathgates, here transistors 138 and 134 are coupled between the BLT and BLC lines 82 and 80 and the RBT and RBC lines 90 and 92, respectively. A pair of write passgates 142 and 144 couple the BLT and BLC lines 82 and 80 to the WBT and WBC lines 76 and 74 via terminal 68 and 66, respectively. A column select circuit 284, which includes a NAND gate 136 and an inverter 140 receives the signal ISO via terminal 132 and the column line from the column select bus that is associated with the corresponding pair of BLT and BLC lines. For example, in one aspect of the invention, Y=15. Thus, there are 16 BLT/BLC line pairs that can be coupled to WBT and WBC lines 76 and 74. Thus, the circuit shown in FIG. 6C is replicated 16 times, one circuit for each BLT/BLC pair. Each of these 16 replicated circuits is coupled to a different one of the 16 lines that form the column select bus. Thus, when a particular memory cell is to be either read from or written to, the circuit associated with the corresponding BLT/BLC line pair has its column select line carry an active signal to couple the BLT and BLC lines to the appropriate read or write lines as is further discussed below.

The column select circuitry 78 is used for both writing data to and reading data from the memory array block 54. The circuit 74 therefore includes input signals WBT 76 and, WBC 74 for providing data on bit lines BLT 82 and BLC 80 under control of the ISO and column select signals 130 and 132. As will be appreciated, when data is being written to the array the data true is provided on signal line WBT 76 and the data complement is provided on signal line WBC 74. While the data is present on the data bus lines, signals BLCC and EQ are held high while the signal COL 130 and ISO 132 are held high. The output of NAND gate 136 is low to turn on read control transistors 138 and 134 and the output of inverter 140 is high to turn on write access transistors 142 and 144. Data is thus passed from WBT 76 to BLT 82 and from WBC 74 to BLC 80 so that data is on the column lines for storing in each individual memory cell.

In operation, during a read or a write cycle, the $\overline{\text{BLL}}$ signal goes active low to pull up the BLT and BLC lines to approximately VCC. Prior to either a read or a write cycle, the $\overline{\text{BLEQ}}$ signal goes active low to equilibrate the associated BLT and BLC lines. The $\overline{\text{BLEQ}}$ signal then goes inactive high before the $\overline{\text{BLL}}$ signal goes active low. Also during a read or a write cycle, both the ISO and column select signals go active high to activate and thus close both the read passgates 276 and 278 and the write passgates 142 and 144. Such a circuit structure eliminates the need for separate passgates for the sense amplifier 94 (FIG. 2) that is coupled to the RBT and RBC lines 85 and 87. During a write cycle, the ISO signal remains active high during the entire write cycle. The ISO signal remains active high only for an initial period of a read cycle and then goes inactive low disabling, i.e., opening all of the passgates 138. 134, 142 and 144. This decouples the sense amplifier 94 from the BLT and BLC lines after it has sensed enough of the data value stored in the memory cell such that it can attain its steady state value more quickly because the parasitic capacitances associated with the BLT and BLC lines (and also the WBT and WBC lines 58 and 56 which are also coupled to the sense amp via the passgates 280 and 282) from the inputs of the sense amplifier.

As discussed above, one problem with the prior art is that a single ISO signal and a signal column select bus were coupled to all the memory blocks in a memory device. Thus, even in unselected memory blocks the ISO and column select signals could go to active levels and thus cause the switching of the NAND gate 136, the inverter 140 and the passgates 134, 138, 142 and 144. Although other circuitry disconnected the WBT and WBC lines 76 and 74, and the RBT and RBC lines 85 and 87 from the external circuitry so that unaddressed memory cells were not read from or written to, the switching of the aforementioned components caused significant dynamic current to be drawn from the power supply. Considering the relatively large number of memory blocks present on a memory device, this dynamic current draw became a significant factor in the power used by the memory device.

Referring to FIG. 2 in one aspect of the invention, the block read-write control circuit 125 generates a separate ISO signal for each memory block. Thus, for all unselected memory blocks, the ISO signal remains inactive low during both read and write cycles to prevent the column select circuit 78 in unselected blocks from drawing dynamic current from the power supply. In the embodiment, the memory device 50 of FIG. 1 that has 32 memory blocks 14, where four memory blocks 14 are selected during each read or write cycle, then only four memory blocks 14 instead of 32 memory blocks 14 draw dynamic current during a read or a write cycle. Thus, in such an aspect of the invention the dynamic current drawn from the power supply during read and write cycles is only one-eighth the dynamic current drawn by known memory devices. Such a significant reduction in dynamic power use allows the memory device to be used in low power applications such as where the memory device 10 is powered by a battery.

Although a specific circuit is shown for the column select circuit 78 of FIG. 2, it is understood that other similar circuitry may be used to obtain the same advantages. For example, the P-channel transistors may be N-channel, and the N-channel transistors may be P-channel. Furthermore, a gate other than the NAND gate 136 may be used to form the column select circuit 284.

Figure 6D:
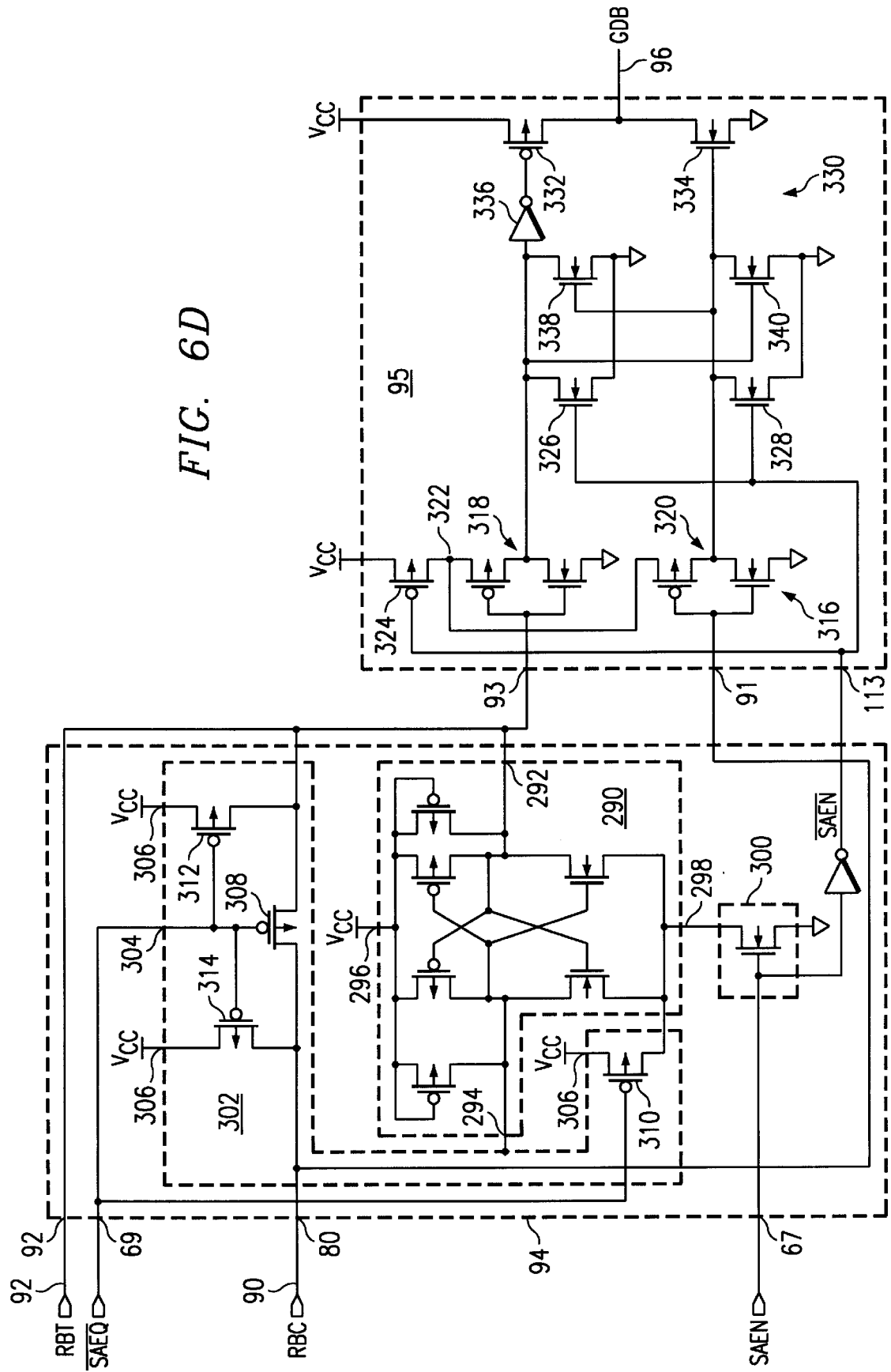
FIG. 6D is a detailed schematic of the sense amp and global bus driver of FIG. 2.

FIG. 6D is a schematic diagram of the read circuit 94 and the global data bus driver 95 of FIG. 2.

The read circuit 94 includes a sense amplifier 290 that has a first input terminal 292 that is coupled to the RBT signal on the line 92 and a second input terminal 294 that is coupled to the RBC signal on line 90. The sense amplifier also includes a first power terminal 296 that is coupled to a voltage VCC and a second power terminal 298. An enable circuit 300 which here comprises an N-channel transistor, has a control terminal coupled to the SAEN signal via the input terminal 67 and has a pair of switch terminals coupled between the power terminal 298 of the sense amplifier 290. An equilibrate circuit 302 has an equilibrate terminal 304 that is coupled to the signal $\overline{\text{SAEQ}}$ via the terminal 69. The equilibrate circuit 302 is also coupled to voltage VCC via power-supply terminals 306. The equilibrate circuit 302 includes a first equilibrate switch 308 that has a control terminal coupled to the $\overline{\text{SAEQ}}$ signal and a switchable path coupled between the RBC line 90 and the RBT line 92. A second equilibration switch 310 has a control terminal coupled to $\overline{\text{SAEQ}}$ and a switchable path coupled between VCC and the second power terminal 298 of the sense amplifier 290. A third equilibration switch 312 has a control terminal coupled to the $\overline{\text{SAEQ}}$ signal and a switchable path coupled between VCC and the RBT line 92. A fourth equilibration switch 314 has a control terminal coupled to the $\overline{\text{SAEQ}}$ signal and a switchable path coupled between VCC and the RBC line 90.

In operation, during a period of time when neither a read nor a write cycle is being performed by the memory device 50 the $\overline{\text{SAEQ}}$ signal is a active low to cause the equilibrate circuit 302 to equilibrate the sense amplifier by coupling together the RBC line 90 and the RBT line 92 at the input of the sense amplifier and coupling both of these lines to the power supply voltage, here VCC. At the beginning of a read cycle, the $\overline{\text{SAEQ}}$ signal goes inactive high to disable the sense amplifier 290, and the SAEN signal goes active high to enable the sense amplifier 290 by coupling the power terminal 298 to ground. The sense amplifier then amplifies the initial signals placed on the RBC line 90 and the RBT line 92 to give a full signal data value on these lines. For example, depending upon the value of data stored in the memory cell that is read, one of the lines RBT and RBC will be at a logic low level, i.e. 0 volts, and the other of the RBT and RBC lines will be at a logic 1, i.e., VCC volts. The amplified data value is coupled to the global data bus driver 106 via the RBC and RBT lines 90 and 92.

During a write cycle, known read circuits often draw supply current from the power supply that provides the voltage VCC even when the sense amplifier 290 is disabled. For example, referring back to FIG. 6C, during a write cycle, the passgates 276 and 278 are closed, thereby coupling the RBC and RBT lines 90 and 92 to the BLT and BLC lines. Thus, one of the lines 90 and 92 will be coupled to a logic high level, i.e., VCC, while the other line 90 and 92 will be coupled to ground via transistors 142 and 144, respectively. However, because the passgates 276 and 278 are P-channel, the line 90 and 92 that is coupled to ground will actually be at one transistor threshold above ground, i.e., in one embodiment of the invention, approximately 1.5 volts.

Referring to FIG. 6D, in known read circuits, the switch 310 has its control terminal coupled to signal SAEN. With such a configuration and with VCC coupled to one of the lines 90 and 92 and approximately 1.5 volts coupled to the other of the lines 90 and 92, the sense amplifier 290 may draw a supply current through the switch 310 and through the one of the N-channel cross-couple transistors having its gate coupled to the line 90 and 92 carrying VCC. Furthermore, in known read circuits, the $\overline{\text{SAEQ}}$ signal is normally active low during a write cycle to maintain the sense amplifier 290 and an equilibrated state.

Still referring to FIG. 6D, the read circuit 94 and more specifically the sense amplifier 290, draws substantially 0 current from the power supply during a write cycle in which the block associated with the sense amplifier is selected, thus placing VCC on one of the lines 90 and 92 and a threshold voltage approximately 1.5 volts on the other of the lines 90 and 92. This advantage is accomplished by first driving the $\overline{\text{SAEQ}}$ signal in active high both during read and write cycles. In one aspect of the invention, the $\overline{\text{SAEQ}}$ signal is only driven to an active low level when the block that the read circuit 94 is associated with is unselected. Second, the switch 310 has its control terminal coupled to the $\overline{\text{SAEQ}}$ signal instead of the SAEN signal. Thus, during a write cycle with the $\overline{\text{SAEQ}}$ signal in active high and the SAEN in active low, the power terminal 298 of the sense amplifier is uncovered from both VCC and ground. Thus, neither of the cross-coupled N-channel transistors of the sense amplifier 290 can allow a current to flow between the power supply voltage VCC and the line 90 or 92 that carries the threshold voltage. Such a read circuit 88 further reduces the current drawn by the memory device 10 during a write cycle, and thus renders the memory device 10 suitable for low-power applications.

Still referring to FIG. 6D, the global data bus-line driver 95 includes an input stage 316 that includes totem-pole coupled pair of transistor 318 that have their gates coupled to the RBT line 92 via the input terminal 93 and a second pair of totem-pole coupled transistors 320 that have their gates coupled to the RBC line 90 via the input terminal 91. Each transistor pair 318 and 320 is coupled between ground a power distribution node 322. An enable circuit, which here comprises a switch 324 has a control terminal coupled to the signal $\overline{\text{SAEN}}$ via the enable terminal 112, and has a switchable path coupled between the power supply voltage VCC and the power distribution node 322. The enable circuit may also include a first switch 326 having its control terminal coupled to $\overline{\text{SAEN}}$ and having a switchable path coupled between the output terminal of the transistor pair 318 and ground, and a second switch 328 that also has a control terminal coupled to $\overline{\text{SAEN}}$ and a switchable path coupled between the output terminal of the transistor pair 320 and ground. An output stage 330 includes a pair of output driver transistors 332 and 334. The output circuit 330 has a first input that is coupled to the output of the transistor pair 318 of the input stage 316. This input terminal is coupled via an inverter 336 to the gate of the transistor 332. The transistor 332 has a switchable path coupled between power-supply voltage VCC and the GDB line 96. The output stage includes a second input terminal that is coupled to the output of the transistor pair 320. This input is coupled directly to the gate of the drive transistor 334, which has a switchable path coupled between the GDB line 36 and ground. The output stage may also include transistors 338 and 340 coupled as shown, though these are optional.

The global bus driver is a tristate driver. When the sense amplifier is enabled, the global bus driver 95 drives the global data bus to place the appropriate data value on the data bus. At the end of a read cycle, the sense amplifier is disabled and the output of the bus driver is in a high impedance mode as viewed from the global data bus 96. The global bus driver is placed in a tristate mode so that it cannot drive the GDB 96. The state of the GDB 96 is held at its current value by a weak latch within the output buffer whenever the GDB 96 is not being driven. In operation during a read cycle, the $\overline{\text{SAEN}}$ signal is active low, thus forcing the enable signal to supply power from the voltage VCC to the power distribution node 322 via the transistor 324. Thus, the input stage receives the logic levels on the RBT line 92 and the RBC line 90 amplifies these values, couples these amplified values to the output stage, which then drives the GDB line 96 with the proper data value that was read and amplified by the read circuit 94.

During a write cycle, known driver circuits, which typically lacked an enable circuit, sometimes allowed the driver 95 to draw a supply current. For example, as stated above, during a write cycle where the memory block associated with the circuit 95 is selected, one of the lines 90 and 92 will have a logic high value while the other has a threshold value in one embodiment of the invention 1.5 volts. As shown, a 1.5 volt signal applied to either the transistor pairs 318 and 320 would cause the transistors of that pair to become partially active, thus drawing a current, often called a "crowbar" current from the VCC power supply to ground. Because there are typically eight drivers 95 per memory block times 4 selected memory blocks, this causes a significant supply current to be drawn from the power supply. Furthermore, it is sometimes desirable during initial testing and burn-in of the memory device 10 to write to all memory locations simultaneously with a VCC voltage of approximately 9 volts instead of the normal operating VCC voltages of between the 3 and 5 volts. Thus, in such a burn-in mode, all of the write memory blocks are selected and with a higher voltage for VCC, the crowbar current drawn from the supply can be quite substantial.

The structure of the data bus line driver 95 substantially eliminates the crowbar current such that the circuit 95 draws substantially 0 supply current during a write cycle when the circuit 95 is disabled. In operation during a write cycle, the $\overline{\text{SAEN}}$ signal is inactive high. This opens the switch 324 and thus uncouples both of the transistors pairs 318 and 320 from the power supply. Thus, regardless of the voltage level at the input terminals 91 and 93 of the driver 95, the transistor pairs 318 and 320 are prevented from drawing supply current. Also, the transistors 326 and 328 drive the inputs to the output stage to the appropriate levels so that both drive transistors 332 and 334 are in a nonconducting state so that the driver circuit 95 drives no signal onto the GDB line 96. Thus, the circuit 95, when disabled, draws substantially 0 supply current regardless of the signal that was present at its input terminals 93 and 91.

FIG. 7 is a schematic diagram of one embodiment of the block read/write control circuit 125 of FIG. 2. As stated above, in conjunction with FIG. 2, in one embodiment of the invention, there is one circuit 125 for each memory block 14 (FIG. 1). In another embodiment shown in FIG. 8, the circuit 24 is constructed to service two memory blocks 14. In this case, one signal for each block is generated. For example, a block write left ($\overline{\text{BLKWL}}$) and a block write right ($\overline{\text{BLKWR}}$) are generated, one for a first block, here called the left block, and the other for a second block, here called the right block. It is understood, however, that the circuitry for both embodiments of the circuit 125 can be similar to that shown in FIG. 7.

The circuit 125 receives a single bit test (SBT) signal, a write block ($\overline{\text{WRTB}}$) signal, a reset block (RESETB) signal, a block select left (BSL) signal, a block select right (BSR) signal. The circuit 125 receives other signals that are ignored here for clarity. These other signals have little or no effect on the inventive concepts discussed herein.

As shown, the circuit 125 includes circuitry that generates an active low $\overline{\text{BLKWL}}$ signal when the left block is selected during a write cycle. Likewise, the circuit 125 generates $\overline{\text{BLKWR}}$ when the right block is selected during a write cycle. The circuit 125 generates $\overline{\text{BSBTL}}$ and $\overline{\text{BSBTR}}$ signals during a single bit test mode write cycle when the left and right blocks are selected, respectively.

The circuit 125 generates an inactive high logic level for the $\overline{\text{SAEQL}}$ signal whenever the left block is selected either during a read cycle, a write cycle or any other cycle. The circuit 125 generates an active low level for the signal $\overline{\text{SAEQL}}$ under certain conditions when the left block is unselected.

The circuit 125 generates an active low signal level for the $\overline{\text{ISOL}}$ signal whenever the left block is unselected. The circuit 125 generates an inactive high level for the $\overline{\text{ISOL}}$ signal whenever the left block is selected during a write cycle and during an initial portion of a read cycle when the block is selected as discussed above in conjunction with FIG. 6C.

The circuit 125 generates an active high level for the SAENL signal whenever the left block is selected and during the latter portion of the read cycle after the sense amp provider has been initially charged with the data value as discussed above in conjunction with FIG. 6C. Thus, in one embodiment of the invention, the circuit drives the ISOL signal active low and the SAENL signal active high substantially simultaneously. Thus, the sense amplifier 290 (FIG. 6D) is not enabled until it is initially charged with the data value from the memory cell and then uncoupled from that memory cell.

The operation of the circuit 125 is described with reference to the signals for the left block, it being understood that the signals for the right block are generated in a similar manner. Furthermore, the circuit 24 can be structured with different logic gates, and combinations thereof as shown and still generate the signals as described.

FIG. 8A is a detailed schematic of one embodiment of the reset control circuitry 84. According to the embodiment of FIG. 8A, disable logic 143 has input signal lines SAENR 142 and SAENL 144 to a NOR gate 146 whose output is provided to a NAND gate 148. These lines 142 and 144 correspond to line SAEN 67 of FIGS. 2 and 6E for a single memory block 54. The signals are labeled SAENR and SAENL because they are signals SAEN 67 from the left and right blocks 54. During a write, both signals SAENR and SAENL are low so that the output of NOR gate 146 is high and the output of NAND gate 148 is high. These signals are provided to permit disabling of the reset control block under certain conditions, such as during a read. during certain test modes or at other times as desired. In one alternative embodiment, such as that shown in FIG. 5, the disable logic need not be present.

The signal lines LC 129 and LCS 127 permit a forced control over NAND gate 150 which is part of the reset logic 128. In one embodiment, the signal on line LCS 127 is held high at all times during device operation. With LCS held high, the output of NAND gate 152 is controlled by the signal on line LC 129. The signal on line LC is connected to a clock signal which, upon going high, will force NAND gate 150 to generate a reset signal. Under this mode of operation, the generation of the reset signal is controlled by a clock provided by some other circuit on or off the chip. In one embodiment, the clock is provided externally, from an external clock provided by the system or a test station. In another embodiment, a clock circuit on another portion of the chip provides the clock signal for inputting to line LC 129 to generate the reset signal to terminate the write.

The generation of the reset signal causes a write to terminate and resets other circuits of the memory block to be ready for a subsequent read or write. The reset signal is input to a number of circuits on the chip, including the block read/write control and the word line and block select latch.

When the reset signal is enabled, a write is not permitted and enabling the reset signal forces the termination of a write and prepares the circuit for a subsequent write or read, depending on the state of other signals.

In a further alternative embodiment, the line LC 129 is connected to a test pin to force generation of the reset signal in particular test modes. During the test mode, the signal LCS is held high so that application of various test mode signals to pin LC will control the generation of the reset signal by NAND gate 150. When the device is not in test mode, LCS is held low at all times. Holding LCS low ensures that the output of NAND gate 152 is high and thus disables any signal on line LC. With LCS held low, the output of inverter 154 is high which provides a high input to NAND gate 148 so that the state of the output of NOR gate 146 can enable or disable the output of NAND gate 148 for controlling the generation of reset signal from NAND gate 150 from the signals SAENR and SAENL if desired.

In a preferred embodiment, the generation of the reset signal to terminate a write during standard operation is controlled by write simulation circuitry 156 and 158. In the preferred embodiment shown in FIG. 8A reset control circuit 84 includes two write simulation circuits, the simulation circuit 156 receiving write data from the memory array block 54 on the left and memory simulation circuit 158 receiving write data from the memory array block 54 on the right. The lines WBCL and WBTL correspond to WBC 74 and WBT 76 from the write driver 75 of the left array block 54. Thus, the inputs are labeled WTBL and WBCL for the memory array block 54 on the left which inputs to simulation circuit 156 and WBTR and WBCR for the memory array block 54 on the right which inputs signals to simulation circuit 158. The structure and operation of memory simulation circuits 156 and 158 are identical and therefore only the structure and operation of simulation circuit 156 is described in detail, corresponding structure and operational characteristics apply to memory simulation circuit 158.

The write data true is provided on line 160 and the write data complement is provided on line 162 to NAND gate 164. Simultaneously, the write data is provided to cross coupled transistors 166 and 168 having their gates coupled to the drain of the other transistors and their source regions coupled together. The output node 170 is coupled to the drain of cross coupled transistors 172 and 174. The output 180 of NAND gate 164 is connected to the gate of P-channel transistor 178 and the source/drain node 180 of access transistor 182. The other source/drain region of transistor 182, node 184 is coupled to the gate of transistor 186 so that the state of node 184 controls whether transistor 186 is on or off. Transistor 186 has its source connected to ground through transistor 188. During normal operation, the gate node 192 of transistor 188 is held high so that the source of transistor 186 is always connected to ground. During a test mode, a clocked control mode or a forced reset mode, LCS signal is taken high which brings node 192 low to hold transistor 188 off. This thus disables the operation of the memory simulation circuit 156 so that the output of NAND gate 150 and generation of the reset signal is controlled by signal LC and cannot be controlled by circuits 156 or 158.

The drain of transistor 186 is connected to output node 190. Node 190 provides an input to NAND gate 150 for generation of the reset signal, as explained in more detail herein. The drain of transistors 194 and 196 are also connected to node 190 so that memory simulation circuit 158 may also exert control over output node 190. The output node 180 of NAND gate 164 is also connected to transistor 198 which is coupled to VCC through transistor 200. Transistor 202 provides a parallel path for connecting VCC to node 190.

The structure of memory simulation circuit 156 to generate the write termination signal will now be described. In a preferred embodiment, write simulation 120 includes a memory cell replicate circuit. Cross coupled transistors 172 and 174 and access transistor 182 are constructed and connected to replicate those same transistors of a memory cell in the memory array. The transistors are preferably sized with the exact dimensions and positioned with the exact placement as a memory cell within the array. All the electrical connections and processing performed in these circuits is identical to those for the memory cells in the array. Therefore, these transistors 172, 174 and 182 will exactly simulate an actual memory cell within the array on the same memory device 50. While the exact operational characteristics of a memory cell may vary from one device to another for different manufacturing lots, the memory cells on a single die are all constructed using the same mask exposure and process and thus will be virtually identical to each other. Similarly, transistor 182 is sized and positioned identical to the access transistors to one bit line in the memory cell of the array. Further transistors 166 and 168 are each sized and positioned to replicate an access transistor to the other bit line of the memory cells in the array. Transistors 182, 166 and 168 therefore exactly simulates the characteristics of access transistors in the memory cell array for each respective individual die.

The gate of access transistor 182 is connected directly to the same voltage source value which drives the word lines high in the memory cells of the array. In one embodiment, this voltage level equals VCC. In alternative embodiments, the voltage level driving the word line of the memory array may be a boosted voltage level above VCC, and for those instances, the gate of transistor 182 is tied to the same value as the boosted word line voltage. Preferably, the gate of transistor 182 is always directly connected to the voltage supply line rather than directly connected to a word line or simulated word line. As will be appreciated, the word line is taken high to provide access to the memory cells in the individual rows. However, the word line is taken high a selected time before the data is presented to the memory cell for writing and therefore, by the time the data to be written to the memory cell arrives, the word line is already stabilized at high. Therefore, to simulate the time for a write to a memory cell, the gate of the access transistor may be considered as already on and thus the gate of transistor 182 may be permanently tied to the appropriate high voltage. In an alternative embodiment, where simulation of word line turn on characteristics affecting the memory cell is desired, the gate of transistor 182 is coupled to a word line and a word line drive circuit whose voltage will rise and fall with the voltage of the word line in the memory cell array itself.

Transistors 166 and 168 are also sized and designed to simulate access transistors within the memory array. During operation, as explained herein, only one of the transistors, either 166 or 168, is turned on, depending on whether the data presented is low or high, respectively. The other of the transistor in the pair is held off.

Therefore, the one transistor, either 166 or 168, is acting as the access transistor from the bit line to the storage data node for passing data. Turning on one of these transistors simulates taking the access transistor high by addressing it from the word line. In the configuration shown, the transistors are advantageously cross-coupled so they may be driven by the data directly, and whichever data is high, true or complement data is acting as the word line voltage to turn the other transistor on so that low data is always being written to the storage node 170. The cross-coupled access transistors thus provides the advantage that only one transistor will ever be driven off at any one time and the on transistor is being held on long before the low going data arrives because both WBTL 160 and WBCL 162 are held high until the data arrives on the respective bit lines. In an alternative embodiment, an actual word line drive simulation circuit can be used for access to this transistor as well, using the same word line voltage, whether Vcc or boosted as used in this alternative embodiment for transistor 182. The memory cell replica is then constructed in such a way that the write in data is guaranteed to trigger a change in state in the memory cell replicate. One such example of a circuit has been shown, although many equivalent designs could be substituted therefore and still fall within the scope of the invention.

Within each memory block 54 there are eight pairs of signal lines WBC 74 and WBT 76 and therefore, eight pairs of signal lines WBTL 160 and WBCL 162. In one embodiment, if any address is written to the memory block, all eight groups of bit lines, in the memory block must be accessed because the memory is configured to require eight bits to be written to or read from a single memory block simultaneously and one bit line is accessed in each group. There are 16 bit line pairs per group and thus 128 bit line pairs per block. In such a design, for convenience sake, the WBTL 160 and WBCL 162 that are closest to the reset circuit 84 are used. In an alternative embodiment of the memory device 50, all write bus lines in the memory block 54 are sensed because in such an alternative embodiment, any one group of the memory block could be accessed without other groups in the memory block being written to. A memory device 50 such as a x1, x4, x8, x16, etc., rather than the x32-part of one embodiment of the present invention could have the appropriate groupings of bit lines monitored. For example, a x1 design would likely require sensing every bit line or the master data write lines; a x4 design would permit sensing groups of 4; a x8 design would permit sensing groups of 8, etc. In this alternative embodiment, sensing every write bus line in the entire memory block ensures that the reset circuit 84 will receive a signal each time a write is being performed to that memory block.

In preparation for writing data to the memory cell array 154, the data storage node 170 of the simulated memory cell is held high and the storage node 184 is low. Node 170 remains high and node 184 remains low at all times during circuit operation except when a write is actually being performed. Node 170 is held high because the output of NAND gate 164 is low which turns on transistor 178 to provide a high logic level to 170. This turns on transistor 174 which connects node 184 to ground to hold node 184 low. At the same time, node 180 is also held low, it being the output of NAND gate 164 so that no current flows through transistor 182 even if it is turned on. The output of NAND gate 164 remains low by having both write bit true and write bit complement lines 160 and 162 held high when data is not being written to the array. The gates of transistors 166 and 168 are thus both held high. Write bit true line 160 and write bit complement line 162 are coupled to receive the actual write data being written to the memory array itself from signal lines 74 and 76 as shown in FIG. 2. When data is not being written, both 160 and 162 remain high at all times.

When a write is being performed, the write driver circuit 73 receives the data to be written to the memory cell. At a time previous, the address for the individual memory cell in block 54 has been presented to the appropriate address decode circuitry shown in FIG. 3 so that an individual memory cell is selected. The write bit true and write bit complement are provided on lines 76 and 74 to the column select circuitry 78 for presentation to the bit lines 82 and 80 for writing to the memory cells. Simultaneously, the data is presented to NAND gate 164. When the data to be written is presented, one of the bits will go low while the other bit remains high. If the data to be stored is a low, the WBTL line 160 will go low, whereas if the data to be written is a 1, the WBCL line will go low and WBTL line will remain high.

When either one of the write bit lines 160 or 162 goes low, this forces the output of NAND gate 164 high so that node 180 is pulled high. When node 180 is pulled high, transistor 178 is turned off to disconnect node 170 from Vcc. At the same time, one of the transistors 166 or 168 is turned off because the signal connected to the gate of such a transistor goes to ground. A low going signal on either line, 160 or 162, will cause the respective transistor, 166 or 168, to turn off while the other transistor remains on to pass the low going voltage through to the node 170. Assume, for this example, that WBTL goes low on line 160. This turns transistor 168 off to disconnect the high voltage on line 162 from line 170. However, transistor 166 was previously on and remains in the on state. Therefore, node 170 is connected to the low going voltage and begins to approach the low voltage level 160 very quickly because it is a direct pass through connection through transistor 166. This causes transistor 174 to turn off. As transistor 174 is turned off, node 184 is no longer connected to ground. As mentioned previously, node 180 is being driven high by NAND gate 164. With node 180 being driven high, the high voltage is passed through transistor 182 to node 184. Node 184 begins to go high as transistor 174 begins to turn off. Taking node 184 high causes transistor 172 to turn on which will connect node 170 to ground through transistor 172 and hold node 170 low and will act to pull it towards ground if it has not already reached ground. Transistor 166 remains on so that the low going signal on line 160 is connected through to line 170 so that a low logic level is maintained on all connected nodes in the memory simulation circuit.

After a certain amount of time, depending upon the switching speed of the memory cell replicate which simulates a memory cell at the array, the state of the data in the memory cell switches from having a high value stored at node 170 and a low value at node 184 to having a low value stored at node 170 and a high value stored at 184. As soon as the state of the memory cell flips, to move node 184 high, transistor 186 is turned on by node 184 going high. Turning on transistor 186 causes node 190 to discharge to ground through transistor 188 so that the input to NAND gate 150 goes low.

Upon the input to NAND gate 150 going low, the output goes high to generate the reset signal. A high going reset signal is input to the read/write control logic block to terminate writing to the memory array 54 and reset other circuits for writing or reading subsequently. The writing to the memory array is thus forced to terminate and the switching of other transistors takes place so that the circuits may reset to perform another write or read as quickly as possible. The circuit thus provides an internal, self-timed termination of a write to a memory cell. The timing of the writing to the memory cell replicate is selected to exactly mimic the actual time needed to write data to the memory cell. A similar switching of the data stored in the memory cell occurs if the signal on line 160 is high and the write bit complement signal 162 is the data signal which goes low so that either signal going low will cause the state of the data stored in the simulated memory cell 156 to switch and cause node 184 to go high to generate a low going signal at the input of NAND gate 150 to generate the reset signal.

Each memory device 50 thus has a self-timed write interval for each particular memory block. The self-timing feature provides a very fast write, much faster than would be possible by setting some generic write time for all memory devices 50. The termination of the write is assured to occur as quickly as possible after a successful write and thus the device is very fast as compared to prior art devices and yet is assured of always performing a valid write and thus is very reliable.

The presentation of the write data itself simultaneously to the reset control circuit 84 and to the array for writing the data provide an exact and accurate time for the start of the write to the memory cell. When the data is presented to the column select circuitry 78 it passes through transistors 142 and 144 for presentation to the bit lines 80 and 82 within the memory array block 54. At the same time, the data is presented to NAND gate 164 and cross coupled transistors 166 and 168 which are designed to simulate the timing required for the write data to be presented to the memory cell in the memory array itself so that node 184 of the memory cell replicate and node 220 of the actual memory cell are presented with the new data at approximately the same time. Since the structural and operational characteristics of the access gate and the cross coupled transistors of the memory cell and memory cell replicate are identical to each other, the time required for change in the state of the transistor in the actual memory cell 200 will be substantially identical to the time required to change the state of the data in the memory cell replicate. Therefore, the generation of the write termination signal on node 190 following the change of state of data on node 184 will be correctly timed to cause termination of the write after sufficient time to ensure that the write is completed to the actual memory cell but very quickly thereafter so that the circuit is immediately reset for the subsequent cycle, whether write or read, just as quickly as possible.

Figure 13A:
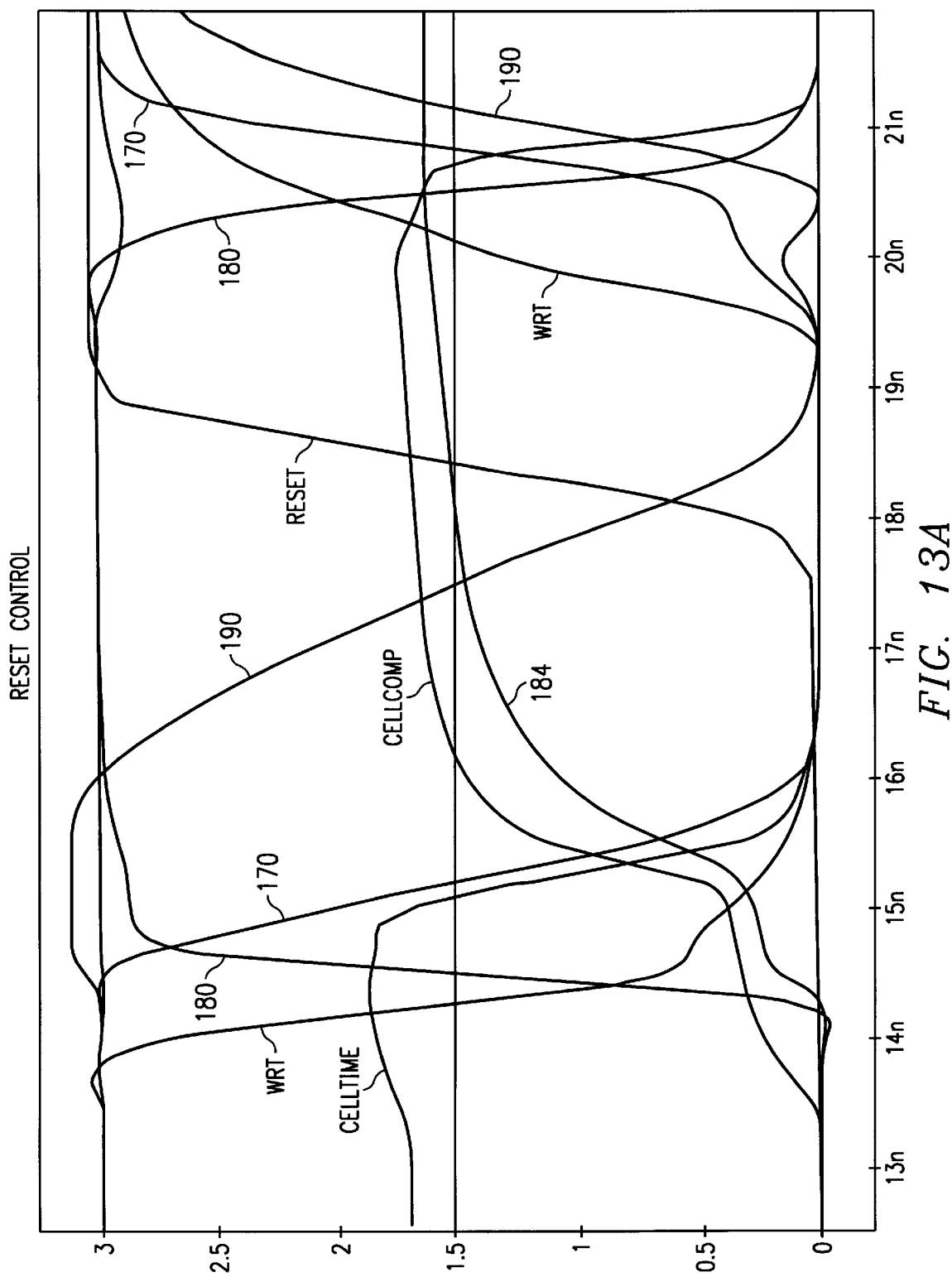
FIG. 13A shows the voltage versus time at various nodes in FIG. 8A.

FIG. 13A illustrates the timing of various signals within the simulated memory cell as shown in FIG. 8A. In the example shown, WBT and WBC, signal lines 160 and 162, respectively, are held at approximately 3 volts at the start of a write. In the particular example shown, the data being written to the memory cell in the array is a 0. Therefore, signal WBT falls from the high 3 volts to 0 volts as the data is presented to the column select circuit 78. At the same time, the data is presented on signal line 160, shown as WBT in FIG. 13 and WBTL in FIG. 8A. Approximately 0.25–0.5 nanoseconds after WBT begins to fall, node 180 goes high as the output of NAND gate 164 switches from low to high. Shortly thereafter, node 170 goes from 3 volts to 0 volts as transistors 168 and 178 are turned off, taking the gate of transistor 174 low, turning it off. The high voltage on node 180 begins to turn on transistor 172 while leaving transistor 166 off to hold node 170 at a low voltage. Transistor 174 is now off and node 184 rises from 0 volts towards a higher voltage. As node 184 reaches the turn-on voltage of transistor 186, node 190 falls from 3 volts towards ground, as shown in FIG. 13A. As node 190 approaches ground, the output of NAND gate 150 is switched from low to high and a reset signal is output by inverter 153. The exact slope, and timing for which the reset signal is generated will, of course depend upon the switching characteristics and speed of NAND gate 150 and inverters 151 and 153, and the slope and position shown is an example of that which could be expected from certain configurations.

The reset and reset bar signal are input to the block read/write control circuit 125 as shown in FIG. 7. In addition, the reset signal is received by the word line and block select latch 104. Upon receiving the reset and reset bar signals, the block read/write control circuit as shown in FIG. 7 permits the enabling of the sense amplifier and deselects the blocks of memory for reading or writing. The reset signal is thus effective to terminate a write and prepare the circuit for a subsequent read or write under the direction of the next set of signals to be received. After the reset signal goes high, both write lines WBT 76 and WBC 74 are both brought high. Regardless of whether the data bit written was a logic high or a logic low, both lines are brought to high when the reset signal goes high. Having both WBTL 160 and WBCL 162 high causes the output of NAND gate 164 to be driven low so that node 180 falls low as shown in FIG. 13A. Shortly thereafter, node 170 is driven high by the cross coupled transistors 166 and 168 both being turned on and also as a result of transistor 178 being, turned on to pull node 170 toward VCC through transistor 178. This causes node 184 to go low as transistor 174 is turned on so that transistor 186 is turned off by node 184 going low. This causes node 190 to rise to disable the reset signal output by NAND gate 150. The write sense circuit 118 and write simulation circuit 120 have now been completely reset to the original state. The memory cell replicate is now prepared for a subsequent write and will switch the node 170 from high to low regardless of whether the next bit to be written is high or low, as has been explained. The circuit of FIG. 8A is thus caused to be reset immediately upon the generation of the reset signal and the final step in the reset procedure is the disabling of the reset signal so that the circuit is again configured to repeat the operation.

FIG. 13A is a simulation of the operation of the reset control circuit and a memory cell in the array. Also shown in FIG. 13A is the state of data in an actual memory cell 200 within the array itself. The state of the memory cell having the true data as shown as cell true in FIG. 13 and the complement is shown as cell comp. As can be seen, cell true follows closely behind WBT and node 170 almost exactly tracks cell true. The scale divisions of FIG. 13A being shown in 0.2 nanosecond divisions, it can be seen that the simulated timing of cell true and node 170 is within 0.2 nanoseconds of each other and thus is a fairly accurate simulation. Similarly, node 184 is an accurate and somewhat delayed simulation of cell comp. As can be appreciated, it is desired to have node 184 at least a brief period of time delayed behind cell comp to ensure that the writing to the memory cell is fully completed before node 184 switches to the new state to cause generation of the reset signal. Thus, having the memory replicate cell change state at approximately the same time, slightly delayed as the actual memory cell of the array is advantageous for generating the reset signal at almost exactly the same timing that the write is fully completed of that same data to the memory cell itself. Advantageously, this provides for a very fast write to the memory cell because the reset signal is generated as quickly as it could possibly occur after the write is confirmed as having been completed. Using the data itself that is written to the memory cell as the start signal for a write thus provides significant advantages not possible in the prior art.

FIG. 8B is an alternative embodiment of the reset control circuitry 84. The alternative embodiment includes a time control circuit 126 which in this embodiment has two parts, a slow time control circuit 126a and a fast time control circuit 126b. The time control circuit 126 permits the time at which the reset signal is generated to be advanced or delayed as selected by the manufacturer or the user. The fast time control circuit 126b contains additional transistors which advance the timing of the reset signal so that the reset signal is generated earlier in the write for a faster termination of the write. The slow time control circuit 126a contains delay gates to delay the generation of the reset signal so that it occurs later in the write.

Figure 9:
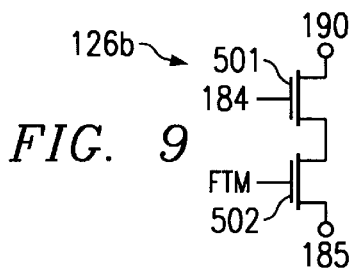
FIG. 9 is a detailed schematic of one embodiment of a fast write circuit as shown in FIG. 8B.

FIG. 9 shows an example of a fast time control circuit 126b. This fast time control circuit 126b includes transistors 501 and 502. The drain of transistor 501 is connected to node 190 and its gate is connected to node 184. Transistor 502 has its source connected to node 185 and its drain connected to the source of transistor 501. The gate of transistor 502 is connected to a fast time mode signal FTM. When the fast time mode signal is enabled, transistor 502 is turned on and effectively places transistor 501 as a parallel current mode to transistor 186. The sizing of transistors 501 and 502 is selected to provide the desired increased current flow from node 190 to node 185 for a faster discharge of node 190. The increase in speed of the discharge rate can be selected by determining the sizing of the transistors 501 and 502, the larger transistor providing a larger pass to ground for the current from node 190 and slightly smaller transistors providing a smaller additional current path to ground. With either design, a parallel, additional current path is provided for grounding node 190 so that node 190 reaches 0 much faster than would otherwise occur without the additional transistors present.

Figure 13B:
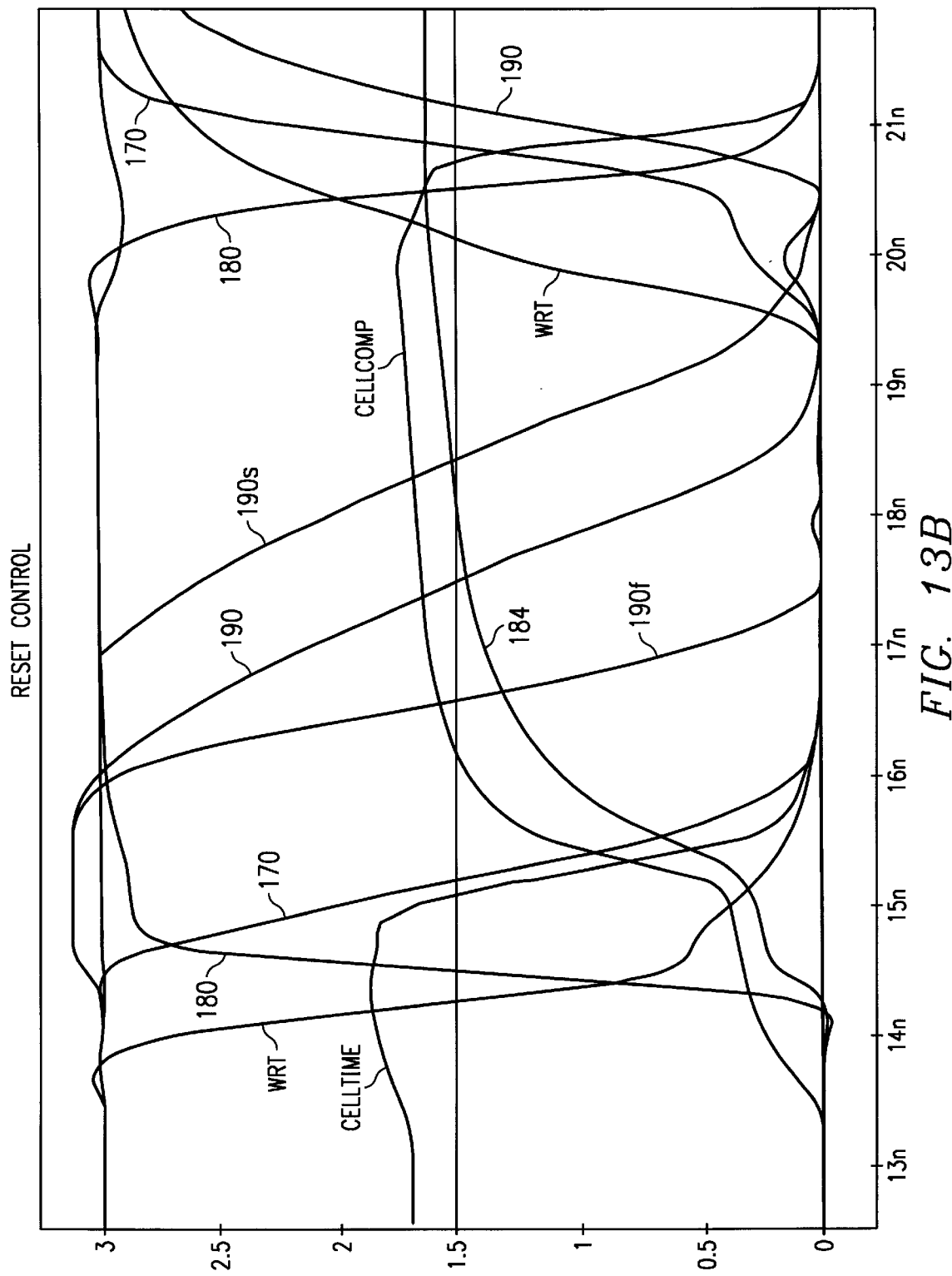
FIG. 13B shows the write timing control circuitry at various nodes of FIG. 8B.

The change in operational speed can be seen by viewing FIG. 13B, a simulation of respective nodes in the alternative embodiment of FIG. 8B.

The same nodes have the same numbers in FIGS. 8A and 8B and FIGS. 13A and 13B. As can be seen, the timing for WTB and nodes 180 and 170 is the same as in FIG. 13A. However, as node 180 rises, the additional transistors in fast time control circuit 126 turn on and cause node 190 to begin to fall more quickly, at a much steeper slope, shown as node 190F in FIG. 13B. Node 190F therefore reaches ground much more quickly and the reset signal is subsequently generated at a more advanced stage in the timing. The reset signal causes other circuits in the memory block to reset as has previously been described. With the fast timer control circuit 126b enabled, the reset control signal is generated earlier in the write so that an even faster write can be completed.

In one embodiment, the number of transistor pairs in parallel between node 190 and 185 is selected to provide the desired increased speed of a write cycle. In a preferred embodiment, only one transistor pair 501 and 502 are provided. Alternatively, for example, if two or even four pairs of transistors 501 and 502 provided in parallel with each other between node 190 and 185, and the large current path to ground provided by four individual paths all being on will significantly advance the time at which the write termination signal is generated. In one embodiment, each of the transistors 501 are made slightly different in size from the other, going from a very small transistor 501 to slightly larger transistors for each of the subsequent transistors in the set. As will be appreciated, the smaller transistors conduct just slightly more current than transistor 186 alone whereas the larger transistors conduct a greater amount of current much more quickly. Alternatively, the threshold voltages or other changes can be made to the transistors so that their turn on speed and current carrying, capability is different.

Further, in this alternative embodiment, each of the transistors 502 is controlled by a different fast test mode signal. For example. FTM1 can provide a slight increase in speed, FTM2 can provide a greater increase in speed, FTM3 can provide an even greater increase in speed and FTM4 the most increase. When the memory is being tested, the various test cycles can invoke any combination of the parallel paths from a single path, such as FTM1 or FTM2, to all paths at the same time, for the fastest possible speed. At the conclusion of the test cycle, a determination is made as to the fastest possible speed which will ensure an accurate write to the memory. For some devices, only a single small transistor will be added to the path provided by transistor 186 so that only a slight time advance is provided for the generation of the reset signal. such as an advance of 0.1 nanoseconds. For extremely efficient devices, the advance may become greater, such as 0.6 to 1 nanosecond greater, by enabling the selective combination of parallel transistor pairs 501 and 502. With only a small amount of overhead circuitry, the operational speeds of the memory devices can be selected and controlled over a large range. Preferably, such selecting and setting the memory cell is performed at the time of manufacture, as explained later herein. However, provision can be made to permit a user to select one or all of the various speed modes to custom select the speed of the device to a desired application.

Figure 10:
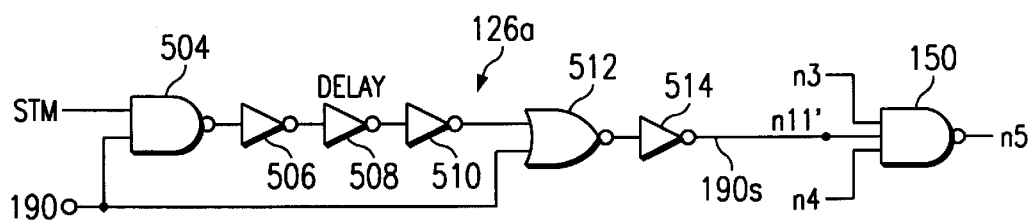
FIG. 10 is a detailed schematic of one embodiment of a slow write circuit of FIG. 8B.

FIG. 10 shows one embodiment of a slow time control circuit 126a. The slow time control circuit 126a includes a NAND gate 504 connected to node 190 and a NOR gate 512 also connected to node 190. The other input to NAND gate 504 is slow time mode input signal 126a. A series of delay inverters 506, 508, 510 are positioned between the NAND gate 504 and the input to the NOR gate 512.

When the slow time control mode is enabled, the STM signal to NAND gate 504 is held high. Node 190 is also held high prior to a write so the output of NAND gate 504 is a 0 and the input, through three delay stages to NOR gate 512, is a 1. With one of the inputs of NOR gate 512 held at a 1, the output is low so that the input to NAND gate 150 is a high and the output is disabled. Upon node 190 going low, one input to the NOR gate 512 immediately goes low because it is directly connected to node 190. The other input is delayed by having to pass through NAND gate 504 to transition the output from a low to a high and then successively through the three inverter stages until the other input to the NOR gate 512 eventually transitions to a 0. Upon both inputs to NOR gate 512 transitioning to a 0, the output goes high so that the input to NAND gate 150 goes low to cause generation of the reset signal at a delayed time after the write has started. The amount of time of the delay can be selected by inserting or removing pairs of inverters between NAND gate 504 and NOR gate 512. The larger the delay, the more inverters are inserted and for a shorter delay, all but one inverter is removed. The amount of delay can therefore be selectively controlled by a manufacturer or a user.

The slow time control circuit 126a is enabled by STM. If STM is disabled, for this circuit being low, then the output of NAND gate 504 is held high so that the input to NOR gate 512 is low. With signal STM disabled, this is the standard state of the slow time control circuit 126a. Upon node 190 going low, the signal is immediately received at the other input of NOR gate 512 so that both inputs are now low and the output becomes asserted high to cause the NAND gate 150 to generate the reset signal immediately. In this circumstance, the only additional delay which has been introduced into the circuit is the switching of NOR gate 512 and inverter 514. These can be designed as extremely fast switching circuits so that the delay from having the slow time control circuit 126a is almost zero when the circuit 126a is disabled.

Examples have been provided for fast time control circuit 126b and slow time control circuit 126a, as can be appreciated, a number of other circuits may be used to provide the same function of advancing or delaying the timing of the generation of the reset control signal from NAND gate 150.

The reset signal itself is not shown in FIG. 13B to avoid confusion because signals 190, 190F and 190S are all shown. Of course, it will be appreciated that the reset signal is generated at the same relative timing after node 190 goes low, as shown in FIG. 13A, so that as the transition of node 190 is advanced or delayed, the generation of the reset signal is correspondingly advanced or delayed.

In one alternative embodiment, the memory cell replicate as shown in FIG. 8B is in fact not an exact replicate of the memory cell of the array. In this alternative embodiment, the access transistors 166, 168 and 182 are made slightly larger than the accessed transistors of the array. The cross coupled transistors 172 and 174 can also be made slightly larger if desired. This permits a slightly faster switching speed of the data in the memory cell replicate. This faster switching speed is desired to permit a wider range for selection of the final write speed for the memory cells of the device. As can be appreciated, the additional circuitry of FIG. 10, together with the switches 186 and NAND gate 150 will cause somewhat of a delay in the propagation of the reset signal after the state of the memory cell is switched. By having a slightly faster memory cell replicate, the delay caused by the switching circuitry, time control circuitry and reset circuitry is compensated for so that the reset signal is generated exactly at the conclusion of a write cycle to the array and that by the time the reset signal is propagated to other parts of the array, the write has just been successfully completed. The write time interval can easily be lengthened or shortened, as desired, using circuit 126 to select the optimum device write speed.

Figure 11:
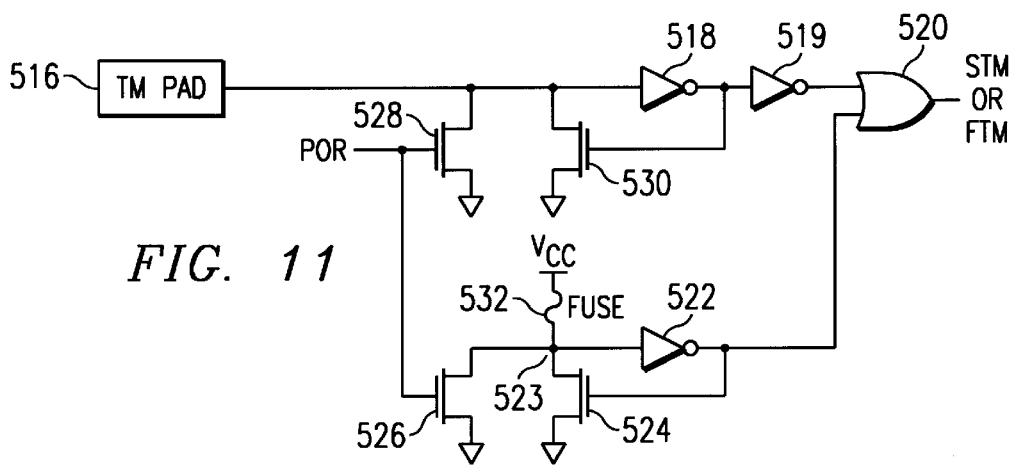
FIG. 11 is a detailed schematic of a write timer test mode and speed selection circuit.

FIG. 11 illustrates a circuit for generating signal STM or signal FTM. In the embodiment of FIG. 8B, there are two such circuits of FIG. 11 for the entire chip. Namely, one circuit of FIG. 11 is provided for generating STM and another circuit is provided for generating FTM. The circuits are selectively enabled for the generation of either STM or FTM as explained hereafter.

The structure of the circuit of FIG. 11 is composed of a test pad mode 516, a pair of inverters 518 and 519 providing one input to the OR gate 520. The other input to the OR gate is provided by an inverter 522 having its input coupled to a fuse which is coupled through VCC and a feedback to a transistor 524 which will hold the inverter 522 in its current state. Another transistor connected to the input of inverter 522 has its gate tied to the power on reset pulse signal as is transistor 528 having its drain connected to the input of inverter 518 and its source connected to ground. A similar holding transistor to transistor 524 is tied between the output of inverter 518 and its input.

The operation of the circuit of FIG. 11 is as follows. During a test mode, test pad 516 has a positive voltage applied so that it is held high. The input to OR gate 520 is thus held high. If the circuit for FIG. 11 is generating the signal STM, then the test pad directly asserts signal STM so that it is applied to the circuit of FIG. 8B to enable the slow time control circuit 126a. When a similar circuit is dedicated to the generation of FTM, providing a high voltage at pad 516 causes OR gate 520 to output a high signal for generation of FTM. The signal FTM can therefore be positively asserted on a control of the test pad 516.

When power is initially applied to this circuit, a short power on reset pulse, POR, is generated. However, POR is a relatively brief signal and the fuse 532. if not blown, remains connected to Vcc to hold or quickly return node 523 high, so that STM and FTM are not asserted. The output of the circuitry is therefore controlled by test pad mode 516 or by the state of fuse 532. If fuse 532 is present, the input to inverter 522 is high so that the output is low and the output of OR gate 520 remains low. In this state, signal STM or FTM are disabled and the reset circuit 84 operates in the standard mode as shown in FIG. 13A. If fuse 532 is blown, the input to inverter 522 is permitted to go to ground because it is not held up by VCC to the fuse 532. When power is initially applied to the chip, the power on reset provides a brief pulse to ground the input of inverter 522 through transistor 526. This pulls the output of inverter 522 high. When the output of 522 is high, transistor 524 is turned on to act as a keeper to maintain the input of inverter 522 low after the POR pulse terminates. Thus, blown fuse 532 will cause the assertion of signal STM or FTM from inverter 520 to enable either the fast time control circuit 126b or the slow time control circuit 126a, depending on which, if either of the two circuits have the fuse blown. It can thus be seen that under a manufacturer's or user's control, the termination timing for a write can be selectively set for each individual die at the time of wafer test and sort or some later time after the manufacture by selectively blowing or not blowing fuse 532.

A method of selecting the duration of performing a write to a memory cell will now be described. According to principles of the present invention, it has been established that the write cycle time can be the limiting factor in overall device performance and device cycle time. This is particularly true in devices having a low Vcc, for example, at 4 volts or lower. At such low voltages, write performance and write cycle time can generally be maintained at acceptable levels. However, the time interval required to complete a write may become so long that it is the limiting factor in operational cycle time and thus strongly affects device performance. By improving write cycle time according to principles of the present invention, this limiting factor is greatly improved, therefore significantly increasing those critical factors of device performance.

During testing, data is written to the memory cells using the standard circuit of FIG. 8B without either the FTM or STM asserted so that node 190 goes low to generate the reset signal at the standard time in the cycle immediately after data is successfully written to the memory cell replicate. After the data is written to the memory cell in the array using the standard timing, the data is read from the memory cells of the array. A standard tester, not shown because it is a standard device, senses whether the data was correctly written to the memory cell. An indication is provided whether the proper data value was correctly written to the memory cell. This writing, reading and sensing of the data may be performed multiple times if desired to confirm that the chip is fully operational at a plurality of memory cells. After one or more sequences of writing the data to the memory cell using the first standard time interval. one of the circuits of FIG. 11, for either STM or FTM is enabled as part of the test. Assuming that all of the data has been correctly written to the memory cell, the circuit for FTM would be enabled via test pad 516. With the signal FTM enabled, the (generation of the reset signal is advanced in the write cycle so that the write cycle is terminated sometime, perhaps as much as one to two nanoseconds faster than at the standard termination time. Data is written to the memory cell using the write duration of the second time interval, such as the faster termination mode. Data is then read from the memory cell which has been written at the second, faster time interval. The data is then sensed to determine whether it was properly written to the memory cell using this second time interval. The testing circuit then outputs an indication as to whether the data was correctly written to the memory cells using the faster, second time interval. If, after numerous tests the data is shown to have been correctly written to the memory cell using the faster time interval, this is an indication that the memory cells are able to effectively be written to and store data at the faster rate, and therefore the part can have a faster access time than would otherwise be possible. After it has been confirmed that the memory device 50 can indeed be successfully written at the faster time interval, the fuse 532 is blown to permanently enable FTM for all memory blocks on the device 150. The device 150 is thereafter provided a write cycle rating of a faster time scale which may be 0.5 nanoseconds to up to one or two nanoseconds faster than the standard write cycle. The time interval for writing is thus a shorter time interval than the standard design for that particular chip, and the chip will have increased demand in the marketplace.

On the other hand, a similar writing, sensing and testing can occur using the slow time mode asserted through a test pad 516, as will now be explained. Assuming a new memory device 50 is being tested, data is written to the memory cell using the write duration of the standard time interval with termination by the reset signal as shown in FIG. 13A. The data is then read from the memory cells, and sensing is performed to determine whether the data was correctly written to the memory cells. For some memory devices 50, there may be just sufficient minor variation in the standard processing lot that, due to an increase in contact resistance, variations in threshold voltage, slight incursions by the bird's beak of the oxide into the active area, or any other number of changes, that writing to the memory cell may not have been completed when the reset signal has generated. The generation of the reset signal will automatically cause termination of the write to the memory cell. If the write has not been completed, the proper data will not be written to the memory cell, and the reading of the data will indicate that the data has not been correctly stored. The chip is now tested using a second time interval which, in this instance, is the longer time interval. This is done by putting the high voltage on test pad 516 for the circuit which generates the slow time mode signal to enable circuit 126a. With circuit 126a enabled, the reset signal is generated at a later point in time in the write so that more time is provided for the actual writing of data to the memory cells in the array. This reset signal can be between 0.5 up to one, two, or possibly four or more nanoseconds longer than the standard time for generating the reset signal as has been explained with respect to FIG. 10. Data is now written to the memory cells using the second, slower time interval in the slow time mode. The data is sensed from the memory cells to determine whether it was properly written during this slower time interval. An indication is output showing whether there was success in writing to the memory cells using the slower time mode. For many memory devices 50, the slower time mode will permit the data to be accurately written to the memory cell, even though it could not be written using the standard time interval. For those memory devices 50 that, after subsequent testing, show that they perform properly at the slower time mode, the fuse 532 is blown for the slow time mode circuitry to permanently enable the slow time mode. The speed of the device is thus rated as somewhat slower, depending on the speed of the slow time mode control circuit 126a. For example, it may be rated as having one 0.25, 0.5 or more nanosecond longer write cycle. However, the chip still has significant value in the commercial marketplace and can be sold at the proper write cycle rating. Previously, such chips had to be discarded at great cost to the manufacturer. With the advantages of this invention, a large number of chips which otherwise were discarded can now be shipped to customers, the only difference being that they are rated at a somewhat slower write cycle, but still having significant commercial value.

This invention has particular merit if a number of redundant rows and columns have been invoked. There are some circuit designs on the market where the invoking of redundant rows and columns causes a very slight decrease in the speed at which data can be written to or read from in a given memory cell on the chip. Unfortunately, in the prior art, this could cause the speed ratings of the chips to suffer greatly, or perhaps even cause some chips to be discarded which were otherwise operational memory devices. According to the principles of the present invention, if such memory device 50 is fully operational but is merely slightly slower because of some process variation, or having redundant rows or columns invoked, the device will still have significant commercial value and can be sold on the market rather than being discarded.

In an alternative embodiment of the present invention, the time mode circuitry is selected and enabled through various other techniques. For example. instead of blowing a fuse, a final metal level can be used to determine which speed circuit is enabled for writing to the memory cell. In an alternative design, an external pin is provided connected to one or both of the test pads 516. The test pad 516 can be accessed via an external pin after the memory device 50 has been enclosed in a package. During a test after packaging, various speeds can be asserted using one, two or additional access pins. The pins connected to the test pads 516 can have other functions during normal chip operation and are used only in the test mode. The appropriate speed can be selected by placing a high voltage on the appropriate pin to permanently disable or selectively enable the particular speed mode desired. In this alternative embodiment, the pins connected to the pads 516 can be made available to the user. This permits a user to selectively test the write timing cycle. In one alternative embodiment, the fuse 532 is coupled so it is blown by an overvoltage from an outside pin, thus permitting a user to select the write time interval. The user, of course, will need to be sophisticated enough to ensure that the write cycle is always made sufficiently long that data is stored during the write if they elect to try and involve changes in the writing timing.

A significant advantage of the present invention is the modifications which can be made to the memory circuit before and after a burn-in cycle. The write speed of the memory can be tested before a burn-in cycle. After a burn-in cycle, the write speed can be tested again to determine whether the chip is still able to operate as fast as before the burn-in cycle. The stressing during the burn-in cycle may cause sufficiently slight variations in the memory cell array that it will not operate in the fast time mode which it was capable of operating in before the burn-in cycle. The standard time mode or slow time mode can therefore be selected as a time interval for the write cycle after a burn-in has been completed rather than discarding the memory device 50.

A further significant advantage and use of the present invention is to find potentially weak bits under test. Assume, for example, that all memory cells pass the standard speed test which is the standard for the part specification. In this circumstance, the part can be marketed and sold as a full speed access part. However, as an additional test feature, the fast time mode is invoked so that a write is performed at the fast speed time interval. The results of this write are sensed and compared to determine whether all bits were successfully written. In the event a few bits were not successfully written, these bits can then be replaced with redundant rows and columns. The part is then tested again at the high speed test mode to ensure that all memory cells can be written to even at a speed beyond the maximum rated speed for the device. Preferably, such testing and replacing of redundant rows and/or columns occurs during wafer sort. The device is then sold as a standard speed device. Even though all memory cells in the array operate at the standard speed device, by stressing the chip at a high speed mode, those potentially weak cells have been identified and eliminated from the array by being replaced with redundant memory cells. The memory device 50 therefore has a much higher reliability than other memory devices on the market because all memory cells have a much higher margin for performing a proper write of the data under the time and voltage parameters of standard operation. Again, this particular test mode and replacement assumes that all memory cells of the array meet the fastest possible specifications at which the chip will be sold. The chip is then tested at one speed faster than the fastest possible write time for the specification sheet. Those memory cells which passed the prior speed test but failed the fastest excess speed test are replaced to weed out potentially weak memory cells.

Figure 12:
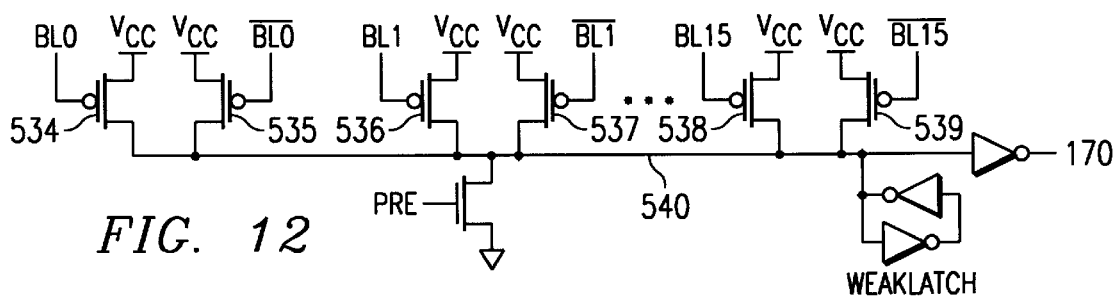
FIG. 12 is a detailed schematic of one alternative embodiment of a write sensing circuit.

FIG. 12 shows an alternative embodiment for a circuit which determine the start of the write. The write sensing circuit 118 of FIG. 5A is shown in a first embodiment of FIG. 8A to include signal from WBT 76 and WBC 74 being input to a NAND gate 164 and to cross coupled transistors 166 and 168. FIG. 12 is an alternative embodiment for such a write sensing circuit 118 of FIG. 5.

According to the alternative embodiment of FIG. 12, the actual bit lines themselves from the memory array are connected to control the gates of transistors. In the embodiment shown, the transistors are P-channel transistors 534–539. When the PRE signal is enabled, node 540 is pulled to ground, and then the weak latch 542 holds node 540 at ground even though PRE goes low. With all bit lines being held high, both the bit line and bit line bar are in the state before a write or a read, the node 540 remains low. When a write is performed to the memory array, one bit line in the pair being written to will be driven low, and the other bit line will be held high. As soon as one bit line in the pair goes low, the P-channel transistor is turned on connecting node 540 to ground. The direct current flow through the respective P-channel transistor tied to VCC is more than enough to overcome the weak latch 542 to drive node 540 high. Node 540 is now being driven high as a direct result of a write on the bit line in a memory cell within the array itself. The output of node 540 then passes through an inverter 544 which is driven low to drive node 170 low as shown in FIG. 8A. With node 170 driven low as shown in FIG. 8A. the state of the memory cell is switched from high to low so that node 184 is driven high to cause transistor 186 to turn on as has previously been described. The reset signal is then generated by NAND gate 1 50 with the subsequent result that the write is terminated. The PRE signal is again asserted to bring node 540 low to reset the memory replicate circuit to having a high stored at node 170 and having all bit lines pulled high.

In this particular alternative embodiment, an entire additional row of P-channel transistors is required for one group of bit lines in each block for directly sensing the writing of data from the bit line within the memory array itself. This provides the advantage that the timing is driven directly from the data on the bit line itself with a very accurate simulation of the time required for writing data to each memory cell.

The advantage of the embodiment of the circuit of FIG. 12 has the potential for an increased accuracy with respect to writing to the memory cell itself. However, it has the distinct disadvantage that a larger number of transistors is required together with the additional conductors for node 540 and the additional conductive line to node 170. Thus, while the circuit of FIG. 12 is one preferred embodiment, the circuit of FIG. 8A in which the write sensing circuit is comprised of a NAND gate 164 and cross coupled transistors 166 and 168 designed to simulate the access time to a memory cell is also a preferred embodiment, and in many circuits will be preferred due to its simplicity and accurate simulation of writing data to the memory cell. As will be appreciated by those of skill in the art, many equivalent write sensing circuits can be designed which sense when data is presented for writing to the memory cell. One of the significant advantages of the invention is that it is the writing of data to the memory cell which starts the timing of the memory replicate circuit for generation of the reset signal. Any equivalent circuits which use the data itself to start the timing of a write may be considered to fall within the scope of the invention.

The write simulation circuit 120 has been shown in the embodiment of FIG. 8A as being the exact same memory cell as used in the array. In the embodiment shown, the memory cell is an SRAM memory cell having cross coupled storage transistors whose storage node is maintained by a polyresistor. As will be appreciated, if the memory cell is a full CMOS, 6-Transistor memory cell within the array, the write simulation circuit 120 would include a memory cell replicate which is also a full CMOS, 6-Transistor memory cell. Similarly, if the memory cell in the array is an EEPROM memory cell or a flash EEPROM memory cell, the write simulation circuit would include a circuit that simulates the time required to write to such a memory cell. Preferably, it would include a memory cell replicate of the very type in the memory cell array, such an EEPROM memory cell, to exactly simulate the write time for a memory cell in the array.

Figure 14:
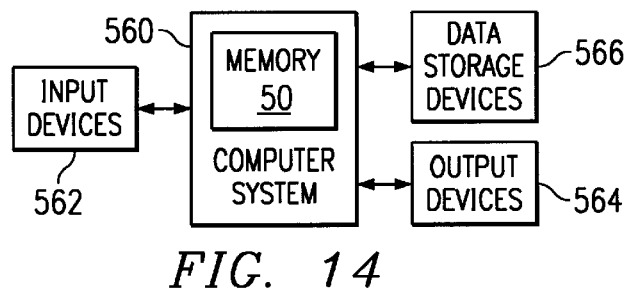
FIG. 14 is a block diagram of a system according to the present invention.

FIGS. 14 and 15 illustrate systems which include a memory device 50 that incorporates the invention. FIG. 14 shows a memory 50 within a computer system 560. The computer system includes a microprocessor and other input/output devices. In a preferred embodiment, the computer system 560 includes a full 32-bit high speed microprocessor, such as those being sold by Intel, Motorola, IBM and other companies. The computer system may have connected thereto various input devices 562 and output devices 564. Additional data storage devices 566 which may include hard drives, CD ROMs or other off-site storage are also connected to the computer system 560. Using the high speed write memory device 50 of the present invention, the computer system 560 is thus able to write to and therefore perform all other operations much faster than was previously possible with other standard memory devices.

Figure 15A:
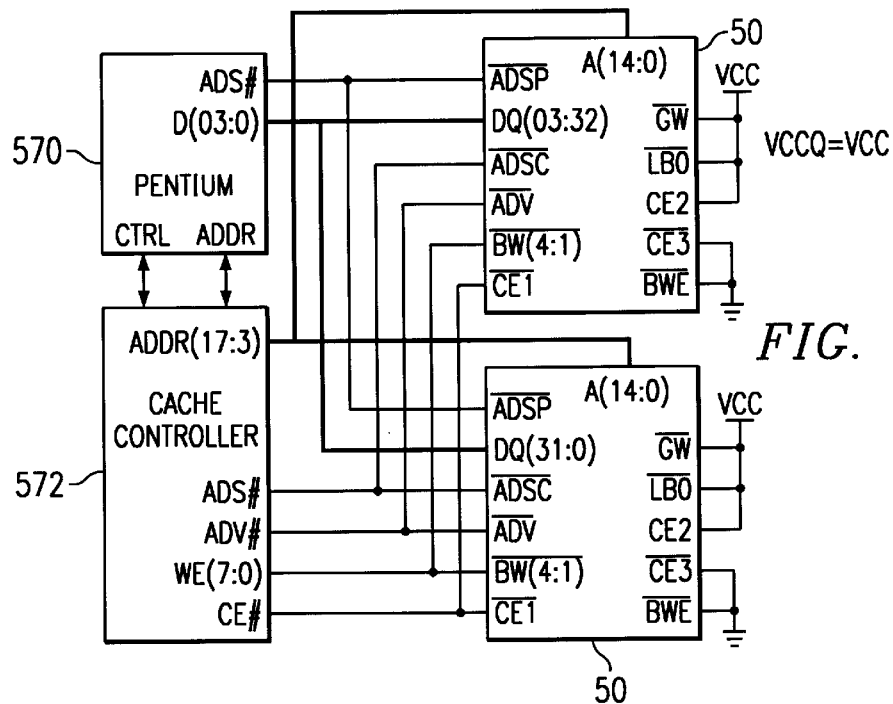
FIGS. 15A and 15B are block diagrams of alternative embodiments of a system using the present invention.
Figure 15B:
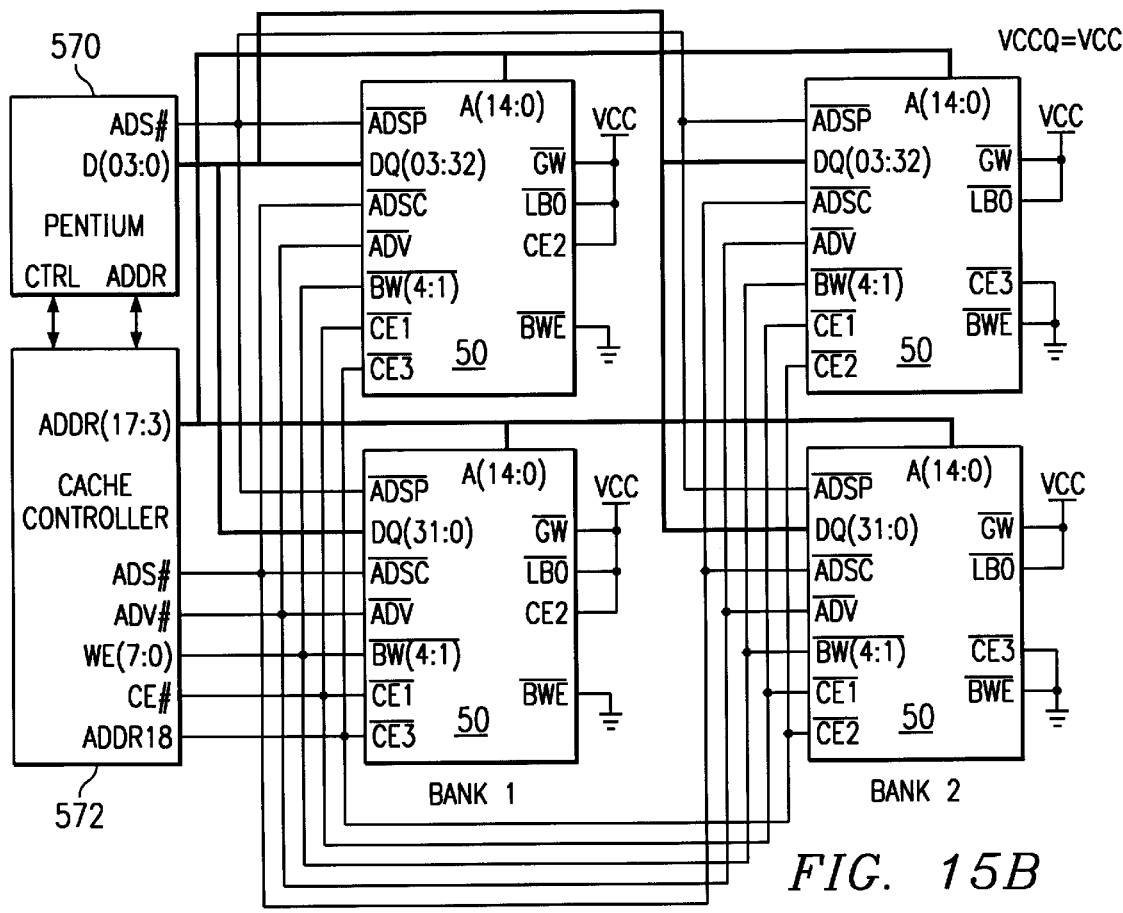

FIGS. 15A and 15B show additional specific uses for one embodiment of the memory device 50 according to the present invention. In one embodiment, the memory device 50 is a 32K=32-bit synchronous pipelined Burst SRAM, called a BRAM. It has pipelined output and can operate as a CMOS cache Burst SRAM.

Burst operations can be initiated with either $\overline{\text{ADSP}}$ (processor address status) or $\overline{\text{ADSC}}$ (controller address status). The burst advance input $\overline{\text{ADV}}$, allows the next burst address to be generated internal to the BRAM.

Cache burst read cycles are initiated with $\overline{\text{ADSP}}$, without regard to $\overline{\text{ADSC}}$ or $\overline{\text{BWE}}$, using the external address clocked into the on-chip address registers when $\overline{\text{ADSP}}$ is sampled low. All Chip Selects must be asserted for $\overline{\text{ADSP}}$ to begin the burst cycle. The output buffers will be enabled by $\overline{\text{OE}}$ when the BRAM is selected. If the device is going from a deselect to a select mode, the device will be selected and the outputs enabled on the following clock cycle. In a read operation, data accessed by the current registered address will be available tKQ from the next rising clock edge in a pipelined fashion.

The $\overline{\text{ADV}}$ input is ignored on the clock edge that samples $\overline{\text{ADSx}}$ asserted, but is sampled on all subsequent clock edges. The address is incremented internally to the BRAM for each read burst access where $\overline{\text{BWE}}$ and $\overline{\text{GW}}$ are sampled high, $\overline{\text{ADV}}$ is asserted low, and both address strobes are high. Data is always valid at tKQ for all Outputs (DQ0–31) from the rising of clock (K).

The $\overline{\text{ADV}}$ input (burst address advance) provides control of the burst counter. The $\overline{\text{ADV}}$ input controls subsequent burst data accesses after the first data of the burst cycle is processed. Each time $\overline{\text{ADV}}$ is active low for subsequent bursts at the rising edge of the clock input, the burst counter is advanced to the next burst address. The address is advanced before the operation. The BRAM will suspend the address burst sequence when the $\overline{\text{ADV}}$ pin is high during positive clock transitions. Upon completion of the full internal burst count, the address will wrap-around to its initial base address. The logic state of the $\overline{\text{LBO}}$ input determines the burst sequence as interleave (i486™ or Pentium™ for Intel bursts) or linear for other processors (RISC. PowerPC, Cyrix M1).

Write cycles are performed by disabling the outputs with $\overline{\text{OE}}$ prior to asserting $\overline{\text{BWE}}$. A global write enable ($\overline{\text{GW}}$=low) writes all 32 bits regardless of the state of $\overline{\text{BWE}}$ or individual byte write select inputs. When $\overline{\text{GW}}$ is high, one or more bytes can be written by asserting $\overline{\text{BWE}}$ and individual byte write selects ($\overline{\text{BW1-4}}$). A byte write table (not shown) lists which byte write selects controls DQ0–31. $\overline{\text{BWE}}$ is ignored on rising clock edges that sample $\overline{\text{ADSP}}$ low, but is sampled on all subsequent rising clock edges. Output buffers are disabled tKQHZ after K when $\overline{\text{BWE}}$ or $\overline{\text{GW}}$ is sampled low (independent of $\overline{\text{OE}}$). Data is clocked into the data input register when a proper write operation is implemented. The write cycles are internally self-timed, and are initiated by the rising edge of the clock input. A write burst cycle continues with the address incremented internal to the BRAM when $\overline{\text{BWE}}$ and $\overline{\text{ADV}}$ are sampled low at the next rising clock edge.

For one embodiment of the memory device 50, connected as shown in FIGS. 15A and 15B, Read or Write operations can be initiated with $\overline{\text{ADSC}}$ instead of $\overline{\text{ADSP}}$. The differences of these inputs are noted as:

1. $\overline{\text{ADSP}}$ must be high when $\overline{\text{ADSC}}$ is asserted low to initiate a cycle with $\overline{\text{ADSC}}$.
2. All Write Enable signals are sampled on the positive going clock edge that samples $\overline{\text{ADSC}}$ low (with $\overline{\text{ADSP}}$ high).
3. $\overline{\text{ADSP}}$ is blocked when $\overline{\text{CE1}}$ is high. The memory device 50 can be selected with either $\overline{\text{ADSP}}$ or $\overline{\text{ADSC}}$, but can only be deselected with $\overline{\text{ADSC}}$ when $\overline{\text{CE1}}$ is high.

The device of FIG. 15A includes two memory devices 50 connected to a Pentium processor to provide 256 KB cache SRAM. The Pentium chip 570, working with cache controller 572. is able to have full 32-bit read/write access from each of the memory devices 50. The memory devices 50 include the self timed high speed write internally and therefore permit faster writing to the respective memory devices under the control of the Pentium 570 and cache controller 572.

FIG. 15B illustrates the computer system having a 512 KB cache comprising four memory devices 50 connected to the Pentium 570 and cache controller 572 to provide additional data storage and burst operational capability. The memory device 50 thus provides an architecture for building a 32K×64-bit burstable L2 data cache SRAM array (256K bytes) by using only two (2) devices, as shown in FIG. 15A. Four (4) devices are used to provide a 512K byte cache, see FIG. 15B. The memory device 50 has three chip enables for easy depth expansion. The chip enables are registered to allow contention free operation when implementing a 512K byte, dual-bank cache configuration.

The invention has been described, including a large number of embodiments and alternative embodiments which may be used to implement the invention. As will be recognized, one embodiment of the invention includes an SRAM memory device. Any equivalent circuits which perform a similar function may be used and substituted for those described herein and thus fall within the claims of the present invention. The claims are therefore not limited by the description provided herein but are broad enough to cover and include alternative embodiments in equivalent circuitry for carrying out the claim features.

What is claimed is:

1. A method of selecting the duration of performing a write to a memory cell, comprising:

writing data to a memory cell using a write duration of a first time interval;

reading data from the memory cell;

sensing whether the data was correctly written to the memory cell;

writing data to the memory cell using a second time interval for the write duration;

reading data from the memory cell that was written using the second time interval;

sensing whether the data that was written to the memory cell using the second time interval was properly written to the memory cell; and outputting the value of the second time interval as the selected write duration for future writes to the memory cell if the data was properly written to the memory cell that was written using the second time interval.

2. The method according to claim 1 wherein the second time interval is shorter than the first time interval, and further including:

modifying a write timer circuit to permit the write duration to be the shorter time interval if the data was properly written using the shorter time interval.

3. The method according to claim 2 wherein modifying a write timer circuit includes:

blowing a fuse within a time mode selection circuit for permanently selecting the time interval for writing data to the memory cell.

4. The method according to claim 1 wherein the second time interval is longer than the first time interval, and further including:

modifying a write timer circuit to require a write duration of the longer time interval if the data was properly written using the longer time interval and if the data was not properly written using the first time interval.

5. The method according to claim 1, further including:

changing the state of data stored in a memory cell replicate;

sensing the change of the state of data stored in the memory cell replicate; and using the time period of the change of the state of data stored in the memory cell replicate as the write duration.

6. The method according to claim 1 wherein the time interval for the write duration is controlled by a clock signal that is external to a memory chip that contains the memory cell.

7. A method of selecting the duration of performing a write to a memory cell, comprising:

simultaneously writing data to a memory cell and a memory cell replicate that was created with the same physical properties as the memory cell;

sensing when the data is finished writing to the memory cell replicate;

generating a reset signal when the data is finished writing to the memory cell replicate; and stopping the writing of data to the memory cell after the reset signal is generated.

8. The method of claim 7 wherein the data is stopped from being written to the memory cell when the reset signal is generated.

* * * * *